(12) United States Patent
Mizuguchi et al.

(10) Patent No.: US 9,231,200 B2
(45) Date of Patent: *Jan. 5, 2016

(54) MEMORY ELEMENT AND MEMORY DEVICE

(71) Applicant: Sony Corporation, Tokyo (JP)

(72) Inventors: Tetsuya Mizuguchi, Kanagawa (JP);
Shuichiro Yasuda, Kanagawa (JP);
Masayuki Shimuta, Kanagawa (JP);
Kazuhiro Ohba, Miyagi (JP);
Katsuhisa Aratani, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/477,190

(22) Filed: Sep. 4, 2014

(65) Prior Publication Data

US 2014/0376301 A1   Dec. 25, 2014

Related U.S. Application Data

(63) Continuation of application No. 13/487,165, filed on Jun. 2, 2012, now Pat. No. 8,885,385.

(30) Foreign Application Priority Data

Jun. 10, 2011  (JP) ................................. 2011-129769

(51) Int. Cl.
*G11C 11/00* (2006.01)
*H01L 45/00* (2006.01)
(Continued)

(52) U.S. Cl.
CPC ........ *H01L 45/1266* (2013.01); *G11C 11/5614* (2013.01); *G11C 13/0011* (2013.01); *H01L 27/2436* (2013.01); *H01L 27/2472* (2013.01); *H01L 45/08* (2013.01); *H01L 45/085* (2013.01); *H01L 45/1233* (2013.01); *H01L 45/142* (2013.01); *H01L 45/143* (2013.01); *H01L 45/144* (2013.01); *H01L 45/145* (2013.01);
(Continued)

(58) Field of Classification Search
USPC ..................................... 365/148, 100, 189.11
See application file for complete search history.

(56) References Cited

U.S. PATENT DOCUMENTS 6,635,914 B2 * 10/2003 Kozicki et al. ................ 257/296
7,483,293 B2 *  1/2009 Pinnow et al. ................ 365/163
(Continued)

FOREIGN PATENT DOCUMENTS

JP  2002-536840  10/2002
JP  2006-319264  11/2006
(Continued)

OTHER PUBLICATIONS

Japanese Office Examination Report issued in connection with related Japanese Patent Application No. JP 2011-129769 dated Nov. 20, 2014.

*Primary Examiner* — Pho M Luu
(74) *Attorney, Agent, or Firm* — Dentons US LLP

(57) ABSTRACT

A memory element includes: a memory layer disposed between a first electrode and a second electrode. The memory layer includes: an ion source layer containing one or more metallic elements, and one or more chalcogen elements of tellurium (Te), sulfur (S), and selenium (Se); and a resistance change layer disposed between the ion source layer and the first electrode, the resistance change layer including a layer which includes tellurium and nitrogen (N) and is in contact with the ion source layer.

16 Claims, 16 Drawing Sheets

(51) Int. Cl.
*H01L 27/24* (2006.01)
*G11C 11/56* (2006.01)
*G11C 13/00* (2006.01)

(52) U.S. Cl.
CPC .......... *H01L 45/146* (2013.01); *H01L 45/1641* (2013.01); *G11C 2213/56* (2013.01)

(56) References Cited

U.S. PATENT DOCUMENTS

| | | | |
|---|---|---|---|
| 7,696,511 B2* | 4/2010 | Ohba et al. | 257/4 |
| 8,492,740 B2* | 7/2013 | Ohba et al. | 257/2 |
| 8,885,385 B2* | 11/2014 | Mizuguchi et al. | 365/148 |
| 2006/0109708 A1 | 5/2006 | Pinnow et al. | |
| 2006/0181920 A1 | 8/2006 | Ufert | |

FOREIGN PATENT DOCUMENTS

| | | |
|---|---|---|
| JP | 2007-189087 | 7/2007 |
| JP | 2009-043757 | 2/2009 |
| JP | 2009-130344 | 6/2009 |
| JP | 2010-062247 | 3/2010 |

* cited by examiner

MEMORY ELEMENT AND MEMORY DEVICE

RELATED APPLICATION DATA

This application is a continuation of U.S. patent application Ser. No. 13/487,165 filed Jun. 2, 2012, issued as U.S. Pat. No. 8,885,385 on Nov. 11, 2014, the entirety of which is incorporated herein by reference to the extent permitted by law. The present application claims the benefit of priority to Japanese Patent Application No. JP 2011-129769 filed on Jun. 10, 2011 in the Japan Patent Office, the entirety of which is incorporated by reference herein to the extent permitted by law.

BACKGROUND

The present disclosure relates to a memory element storing information based on a change of electrical characteristics in a memory layer including an ion source layer and a resistance change layer, and to a memory device.

SUMMARY

As a nonvolatile memory from which information is not erased even if power is turned off, previously proposed are a flash memory, a FeRAM (Ferroelectric Random Access Memory), an MRAM (Magnetoresistive Random Access Memory), and others. Such types of memories are allowed to keep written information for a long time with no supply of power. However, these memories each have advantages and disadvantages. That is, the flash memory is indeed high in integration, but is disadvantageous in terms of operation speed. The FeRAM has the limitations for microfabrication to achieve a higher integration, and also has a disadvantage in a manufacturing process. The MRAM has a disadvantage in power consumption.

In consideration thereof, proposed is a memory element of a new type being advantageous considering the limitations of microfabrication of the existing memory elements as above. This memory element is in the configuration in which two electrodes sandwich therebetween an ion conductor containing specific metal. With such a memory element, one of the two electrodes is configured to contain metal same as that contained in the ion conductor. This allows, at the time of voltage application between the two electrodes, dispersion of the metal in the electrode as ions into the ion conductor, thereby changing the electrical characteristics such as the resistance value or the capacitance of the ion conductor. As an example, Japanese Unexamined Patent Application Publication No. 2002-536840 describes the configuration of a memory device utilizing such characteristics. Japanese Unexamined Patent Application Publication No. 2002-536840 proposes especially to configure an ion conductor by a solid solution of chalcogen element and metal. To be specific, the ion conductor is made of a material being a solid solution of AsS, GeS, or GeSe and Ag, Cu, or Zn, and one of two electrodes contains Ag, Cu, or Zn.

With the memory element configured as described above, however, when the ion conductor is left for a long time in the state of storage with a resistance value thereof being low (for example, "1") or in the state of erasing with a resistance value thereof being high (for example, "0"), or when the ion conductor is left as it is in the atmosphere at the temperature higher than the room temperature, there is a disadvantage of failing in information retention because the resistance value shows a change. If the performance of information retention (characteristics of resistance value retention) is low as such, such element characteristics are not considered good enough for use in a nonvolatile memory.

For storing a change of resistance value as data in a memory element after erasing of any recorded information, proposed is the memory element having the structure of "lower electrode/GdOx/CuZrTeAlGe/upper electrode", for example (for example, see Japanese Unexamined Patent Application Publication No. 2009-43757). However, with such a memory element using GdOx as the layer causing a resistance change, the operation to erase recorded information is expected to use a relatively high level of voltage. Moreover, the memory element is expected to be improved more in terms of retention characteristics (data retention characteristics) because the resistance value after erasing of recorded information shows a large variation, for example.

On the other hand, in Japanese Unexamined Patent Application Publication No. 2010-62247, for example, proposed for getting around the disadvantages described above is a memory element including a layer containing a chalcogen element in a layer causing a change of resistance, and attempt is made to reduce the operating voltage. However, such a memory element does not yet improve sufficiently the retention characteristics and the repetitive operation characteristics, and thus a further improvement of these characteristics is expected.

It is thus desirable to provide a memory element and device having the satisfactory retention characteristics and the improved repetitive operation characteristics.

A memory element according to an embodiment of the present disclosure includes: a memory layer disposed between a first electrode and a second electrode. The memory layer includes: an ion source layer containing one or more metallic elements, and one or more chalcogen elements of tellurium (Te), sulfur (S), and selenium (Se); and a resistance change layer disposed between the ion source layer and the first electrode, the resistance change layer including a layer which includes tellurium and nitrogen (N) and is in contact with the ion source layer.

A memory device according to an embodiment of the present disclosure includes: a plurality of memory elements each including a memory layer disposed between a first electrode and a second electrode; and a pulse application unit selectively applying a voltage or current pulse to the plurality of memory elements. The memory layer includes: an ion source layer containing one or more metallic elements, and one or more chalcogen elements of tellurium (Te), sulfur (S), and selenium (Se); and a resistance change layer disposed between the ion source layer and the first electrode, the resistance change layer including a layer which includes tellurium and nitrogen (N) and is in contact with the ion source layer.

With the memory element (memory device) according to the embodiment of the present disclosure, when voltage or current pulses of "positive direction" (for example, the first electrode side is at a negative potential, and the second electrode side is at a positive potential) are applied with respect to the element in the initial state (the high-resistance state), metallic element contained in the ion source layer is ionized and diffused in the resistance change layer, and then is deposited by bonding with electrons at the first electrode, or remains in the resistance change layer and forms an impurity level. As a result, a low-resistance section (conductive path) containing the metallic element is formed in the memory layer, thereby decreasing the resistance of the resistance change layer (state of recording). When voltage pulses of "negative direction" (for example, the first electrode side is at a positive potential, and the second electrode side is at a negative potential) are applied with respect to the element in the low-resistance state as such, the metallic element that has been deposited on the first electrode is ionized, and then is dissolved into the ion source layer. As a result, the conductive path including the metallic element disappears, and the resistance change layer is increased in resistance (initial state or state of erasing).

Herein, the resistance change layer contains nitrogen in addition to the chalcogen element of tellurium. This accordingly allows the retention characteristics to remain satisfactory, and suppresses degradation by repeated voltage application.

With the memory element and the memory device according to the embodiments of the present disclosure, the resistance change layer contains nitrogen in addition to the chalcogen element of tellurium. This accordingly improves the retention characteristics to be satisfactory, and improves the repetitive operation characteristics.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENT

In the below, an embodiment of the present disclosure is described in detail by referring to the accompanying drawings. The description is given in the following order.

Embodiment

1. Memory Element: Memory element in which a resistance change layer is in the single-layer structure
2. Memory Device Modification (Memory element in which a resistance change layer is in the multi-layer structure)

EXAMPLE

Embodiment

Memory Element

Figure 1:
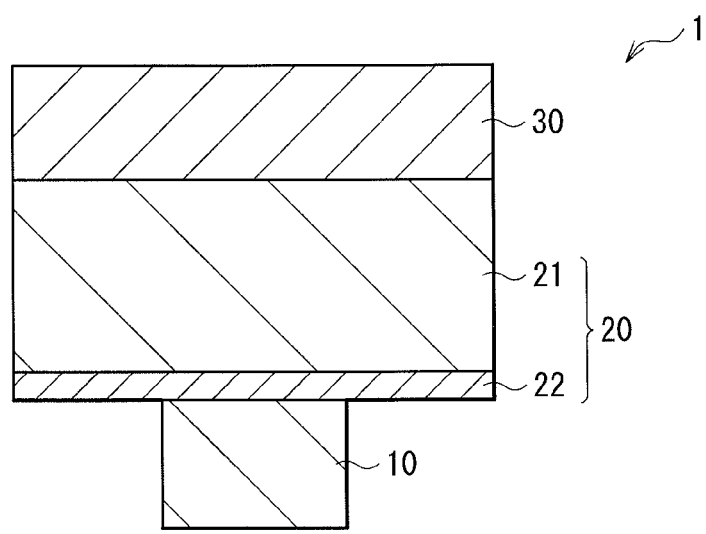
FIG. 1 is a cross-sectional diagram showing the configuration of a memory element according to an embodiment of the present disclosure.

FIG. 1 is a cross-sectional diagram showing the configuration of a memory element 1 according to an embodiment of the present disclosure. This memory element 1 is configured to include a memory layer 20 disposed between a lower electrode 10 (first electrode) and an upper electrode 30 (second electrode).

The lower electrode 10 is provided, for example, on a substrate 41 formed with a CMOS (Complementary Metal Oxide Semiconductor) circuit thereon as will be described later (FIG. 2), thereby serving as a connection section with the portion of the CMOS circuit. This lower electrode 10 is made of a material for wiring used in the semiconductor process such as W (tungsten), WN (tungsten nitride), TiN (titanium nitride), Cu (copper), Al (aluminum), Mo (molybdenum), Ta (tantalum), and silicide. When the lower electrode 10 is made of a material such as copper that possibly causes ion conduction in an electric field, the surface of the lower electrode 10 made of copper or others may be covered with a material that hardly causes ion conduction or thermal diffusion such as tungsten, tungsten nitride, titanium nitride, and tantalum nitride (TaN). When an ion source layer 21 that will be described later contains aluminum, preferably used is a metal film containing one or more of chromium (Cr), tungsten, cobalt (Co), silicon (Si), gold (Au), palladium (Pd), molybdenum (Mo), iridium (Ir), titanium (Ti), and others that are more resistant to ionization than aluminum, or an oxide or nitride film thereof.

The memory layer 20 is configured by the ion source layer 21 on the upper electrode 30 side, and a resistance change layer 22 on the lower electrode 10 side. The ion source layer 21 is in contact with the upper electrode 30. The ion source layer 21 contains an element to be movable ions (cations and anions) that diffuse to the resistance change layer 22. The element that is allowed to be cationized includes one or two or more of metallic elements such as silver (Ag), copper (Cu), and zinc (Zn). An ion conductive material that is to be anionized includes one or more of chalcogen elements including tellurium (Te), sulfur (S), and selenium (Se), for example. The metallic element(s) and the chalcogen element(s) are bonded together, thereby forming a metal chalcogenide layer. This metal chalcogenide layer mainly has the amorphous structure, and serves as an ion supply source.

As for the metallic element that is allowed to be cationized, as is reduced on the cathode electrode during the operation of writing and forms a conductive path (filament) in the form of metal, it is preferable to use an element which is chemically stable and is allowed to be in the form of metal in the ion source layer 21 containing the chalcogen element(s) described above. Such a metallic element includes, other than those described above, transition metals of groups 4A, 5A, and 6A in the periodic table, i.e., Ti, zirconium (Zr), hafnium (Hf), vanadium (V), niobium (Nb), Ta, Cr, Mo, and W, for example. Among these elements, one or two or more are allowed to be used. Additionally, aluminum (Al), germanium (Ge), Si, or others may be used as additive elements to the ion source layer 21.

Examples of the specific composition of the ion source layer 21 as such includes ZrTeAl, TiTeAl, CrTeAl, WTeAl, and TaTeAl. Such specific materials may also include CuZrTeAl obtained by adding Cu to ZrTeAl, and it is preferable to use TeAlZrCuGe obtained by further adding Ge to CuZrTeAl. TeAlZrCuSiGe, which is obtained by further adding the additive element Si, may be also used.

The metallic element in the ion source layer 21 is surely not restrictive to those described above, and may be ZrTeMg including Mg as an alternative to Al. As for the ionizing metallic element, a similar additive element is allowed to be used even if a transition metallic element selected for use is not Zr but Ti or Ta, and, for example, TaTeAlGe may be used. Moreover, the ion conductive material is not restricted to Te, and may be sulfur (S), selenium (Se), or iodine (I), and specifically may be ZrSAl, ZrSeAl, ZrIAl, CuGeTeAl, or others. Note that Al is not necessarily contained, and CuGeTeZr or others may be also used.

Note that the ion source layer 21 may additionally include other elements for the purpose of preventing peeling of film during a high-temperature heat treatment for the memory layer 20, for example. Silicon (Si) is an exemplary additive element that is expected to offer also the improvement of the retention characteristics, and is preferably added to the ion source layer 21 together with Zr. Herein, if the additive amount of Si is not enough, the effect of preventing the film peeling is not sufficiently produced, and if the additive amount of Si is too much, the resulting memory operation characteristics are not satisfactory enough. In consideration thereof, the content of Si in the ion source layer 21 is preferably in the range of about 10 to 45 atomic % to produce the effect of preventing film peeling, and to have the satisfactory memory operation characteristics.

Moreover, by using a metallic element (M) that is more likely to react with Te in the resistance change layer 22 that will be described later, the multi-layer structure of [Te/ion source layer] (containing the metallic element M) is formed. If this is the structure, with a heat treatment after the film formation, the resulting structure is stabilized as [MTe/ion source layer 21]. The element more likely to react with Te may be Al, magnesium (Mg), and others, for example.

The resistance change layer 22 is disposed on the lower electrode 10 side, that is, is provided between the lower electrode 10 and the ion source layer 21. Herein, the resistance change layer 22 is in the single-layer structure, and is in contact with both the lower electrode 10 and the ion source layer 21. This resistance change layer 22 serves as a barrier against electric conduction, and shows a change in resistance value when a predetermined level of voltage is applied between the lower and upper electrodes 10 and 30. In this embodiment, this resistance change layer 22 contains nitrogen in addition to a chalcogen element of Te. Accordingly, the retention characteristics of the memory element 1 are maintained satisfactorily, and the repetitive operation characteristics are allowed to be improved. The resistance change layer 22 is obtained by containing nitrogen at a concentration of 50% or less in the compound of AlTe, MgTe, or ZnTe, for example. To be specific, this resistance change layer 22 contains the elemental substance of Al, Mg, or Zn, or a compound such as AlN, Mg2N3, or Zn2N3, for example. Here, for example, the ratio between Al and N in AlN is Al:N=50:50, and with the addition of Te thereto, the content of nitrogen in the whole resistance change layer 22 is reduced to be less than 50%. In other words, the nitrogen content of 50% is equivalent to the maximum amount of nitrogen in the resistance change layer 22. As will be described later, even with the minuscule amount of nitrogen close to the measurement limit (an estimated value is about 0.1%), the effect to be produced thereby is sufficient. By including Al, the resistance change layer 22 is further improved in retention characteristics and repetitive operation characteristics.

The resistance change layer 22 preferably has the initial resistance value of 1 MΩ or larger, and the resistance value in the state of low resistance is preferably several hundred kΩ or smaller. For reading at a high speed the state of resistance of a microfabricated resistance change memory, the resistance value in the state of low resistance is preferably as low as possible. However, because the resistance value is 40 to 100 kΩ when writing is performed under the condition of 20 to 50 μA and 2 V, the memory is supposed to have the initial resistance value higher than that value. In consideration of making more-than-one-digit difference between the resistance value in high-resistance state and the resistance value in low-resistance state, the resistance value described above is considered appropriate.

Similarly to the lower electrode 10, the upper electrode 30 may be made of a well-known material for semiconductor wiring, and preferably, be made of a stable material not reacting with the ion source layer 21 even after post-annealing.

In the memory element 1 of the embodiment, when a voltage or current pulse is applied by a power supply circuit (pulse application unit; not illustrated) via the lower electrode 10 and the upper electrode 30, the memory layer 20 shows a change in the electrical characteristics (the resistance value) thereof, thereby performing information writing, erasing, and reading. In the below, such an operation is described specifically.

First, a positive voltage is applied to the memory element 1 such that the upper electrode 30 is at a positive potential, and the lower electrode 10 side is at a negative potential, for example. In response thereto, a metallic element in the ion source layer 21 is ionized and diffused to the resistance change layer 22, and then is deposited by bonding with electrons on the lower electrode 10 side. As a result, a filament is formed on the interface of the lower electrode 10 and the memory layer 20. This filament is made of a low-resistance metallic element reduced in the form of metal. Alternatively, the ionized metallic element remains in the resistance change layer 22, and forms an impurity level. As a result, a filament is formed in the resistance change layer 22, which accordingly decreases the resistance value of the memory layer 20 such that the resistance value is changed to be lower (to be in the low-resistance state) than that in the initial state (in the high-resistance state).

Thereafter, even if the memory element 1 becomes free of voltage by stopping the application of the positive voltage thereto, the state of low resistance remains. This means information writing is done. For use in a once-writable memory device, i.e., a so-called PROM (Programmable Read Only Memory), recording is completed only by the process of recording described above. On the other hand, for application use in an erasable memory device, i.e., RAM (Random Access Memory), EEPROM (Electronically Erasable and Programmable Read Only Memory), or others, a process of erasing is expected. During the process of erasing, a negative voltage is applied to the memory element 1 such that the upper electrode 30 is at a negative potential, and the lower electrode 10 side is at a positive potential, for example. In response thereto, in the filament formed inside of the memory layer 20, the metallic element is ionized, and then is dissolved into the ion source layer 21 or is bonded with Te or others, thereby forming a compound such as $Cu_2Te$ or CuTe. As a result, the filament made of the metallic element disappears or is decreased, and the resistance value is increased.

Thereafter, even if the memory element 1 becomes free of voltage by stopping the application of the negative voltage thereto, the resistance value therein remains high. This allows erasing of information written thereto. By repeating such a procedure, writing of information and erasing of the written information are allowed to be performed repeatedly in the memory element 1.

If the state high in resistance value is correlated with information of "0" and the state low in resistance value is correlated with information of "1", for example, the information of "0" is allowed to be changed to the information of "1" in the process of information recording by the application of a positive voltage, and the information of "1" is allowed to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

In this embodiment, the resistance change layer 22 contains nitrogen in addition to the chalcogen element of Te so that the retention characteristics thereof are maintained satisfactorily and the repetitive operation characteristics are improved.

Even if the resistance change layer 22 does not contain nitrogen, containing a chalcogen element improves the retention characteristics of the memory element. In this case, however, because the ion source layer and the resistance change layer contain similar components, these components are easily diffused by application of a voltage. As a result, even if being in the same state (in the low-resistance state or high-resistance state), the resistance change layer shows a change in resistance value by writing and erasing performed for a plurality of times. In other words, the resulting memory element is easily reduced in resistance to pressure, and the repetitive operation characteristics thereof are also impaired. In consideration thereof, previously proposed is to improve the repetitive operation characteristics by using the resistance change layer in the multi-layer structure including a layer containing a chalcogen element, and an oxide layer of gadolinium oxide (GdOx) or aluminum oxide (AlOx), for example. However, this structure causes a reduction of the retention characteristics, and thus has a difficulty in improving both the retention characteristics and the repetitive operation characteristics.

Accordingly, in the embodiment, the resistance change layer 22 includes nitrogen in addition to the chalcogen element of Te to improve the resistance to pressure by suppressing the diffusion of components between the resistance change layer 22 and the ion source layer 21. Because the ion source layer 22 needs not to include any oxide layer, the retention characteristics are not impaired. Moreover, the resistance change layer 22 is expected to be high in resistance value to some extent for sufficient bias at the time of writing or others. When the resistance change layer contains oxygen, for example, this increases too much the resistance value and the resistance to pressure, thereby increasing the voltage for use at the time of operation. On the other hand, with the resistance change layer 22 containing nitrogen, the voltage is kept low, the resistance value and the resistance to pressure both remain good, and the balance of these is appropriately maintained.

Moreover, in the embodiment, the ion source layer 21 preferably contains Zr, Al, Ge, or others as described above. Described below are the reasons.

When the ion source layer 21 contains Zr, this Zr acts as an element to be ionized together with the metallic element such as Cu described above so that the resulting filament is a mixture of Zr and the above-described metallic element such as Cu. Herein, Zr is supposed to be reduced on the cathode electrode during the operation of writing, and is supposed to form a filament in the form of metal in the low-resistance state after the writing. The filament formed as a result of the reduction of Zr is relatively difficult to be dissolved in the ion source layer 21 containing the chalcogenide element(s) such as S, Se, and Te. Therefore, once the state is put in writing, that is, in the low-resistance state, the resulting low-resistance state is retained more easily than in the case with a filament containing only the above-described metallic element such as Cu. For example, Cu is formed as a filament by the operation of writing. However, Cu in the form of metal is dissolved easily in the ion source layer 21 containing the chalcogen element(s), and in the state of no application of a voltage pulse for writing (in the state of data retention), Cu is ionized again and the state is changed to high resistance. Thus, the resulting characteristics of data retention are not satisfactory. On the other hand, combining Zr with appropriate content of Cu facilitates amorphization, and keeps uniform the microstructure of the ion source layer 21, thereby contributing to the improvement of the characteristics of resistance value retention.

Also for retention of the high-resistance state during erasing, when the ion source layer 21 contains Zr, the following effect is to be produced. That is, when a filament of Zr is formed, and Zr is dissolved in the ion source layer 21 again as ions, for example, due to the lower ion mobility of Zr at least than Cu, the Zr ions are resistant to move even if the temperature is increased, or even if they are left as they are for a long time. As such, Zr in the form of metal is not easily deposited on the cathode electrode (for example, on the interface between the ion source layer 21 and the resistance change layer 22), and thus remains high in resistance even if it is kept in the temperature higher than the room temperature or if it is left as it is for a long time.

Moreover, when the ion source layer 21 contains Al, if the upper electrode 30 is biased to a negative potential as a result of the erasing operation, formed is an oxide film stable on the interface between the ion source layer 21 behaving like a solid-electrolyte layer and the anode electrode. This makes stable the high-resistance state (the erasing state). This also contributes to the increase in the repetition frequency considering the self-reproduction of the resistance change layer 22. Herein, Al is surely not the only option, and Ge or others acting similar thereto may be also included.

As such, when the ion source layer 21 contains Zr, Al, Ge, and others, compared with the memory element of the related art, the resulting memory element has the improved characteristics of wide-range resistance value retention, those of high-speed operation of writing and erasing, and those of low-current operation, and the increased repetition frequency. Moreover, if a resistance state intermediate between high and low is created through adjustment of an erasing voltage during a change of resistance from low to high, for example, the resulting intermediate state is allowed to be retained with stability. Accordingly, the resulting memory is capable not only of binary storage but also of multilevel storage. Herein, such an intermediate state is allowed to be created also through adjustment of the amount of atoms for deposition by changing a write current during a change of resistance from high to low.

Such various characteristics important for the operation of memory including the characteristics of operation of writing and erasing with voltage application, the characteristics of resistance value retention, and the repetition frequency of operation, vary depending on the addition content of Zr, Cu, and Al, and also Ge in the ion source layer 21.

When the content of Al is too much, the Al ions become easy to move, thereby creating the state of writing due to reduction of the Al ions. Because Al is not stable enough in the form of metal in the chalcogenide solid electrolyte, the characteristics of low-resistance writing state retention are degraded. On the other hand, when the content of Al is too little, the effect of improving the erasing operation itself or the characteristics of high-resistance region retention are impaired, thereby decreasing the repetition frequency.

If the content of Zr is too much, the resistance value of the ion source layer 21 is decreased too much, thereby failing in effective voltage application to the ion source layer 21, or resulting in a difficulty in dissolving Zr in the chalcogenide layer. This especially causes a difficulty in erasing, and the threshold voltage for erasing is increased according to the addition content of Zr. If the content of Zr is all too much, this results in a difficulty also in writing, that is, in decreasing of resistance. On the other hand, if the addition content of Zr is too little, the effect of improving the characteristics of wide-range resistance value retention as described above is impaired.

Although adding an appropriate content of Cu to the ion source layer 21 indeed facilitates amorphization, if the content thereof is too much, Cu in the form of metal degrades the characteristics of writing retention or adversely affects the speed of the writing operation as Cu in the form of metal is not stable enough in the ion source layer 21 containing the chalcogen element(s). Whereas a combination of Zr and Cu produces the effect of making amorphous the ion source layer 21 with ease, and of keeping uniform the microstructure of the ion source layer 21. This accordingly prevents the material components in the ion source layer 21 from becoming not uniform by the repeated operation, thereby increasing the repetition frequency and improving the retention characteristics. When the content of Zr in the ion source layer 21 is appropriate, the filament of metal zirconium (Zr) is supposed to remain in the resistance change layer 22 even if the filament made of Cu is dissolved again into the ion source layer 21, and thus the state of low resistance remains. As such, the characteristics of writing retention are not affected.

Moreover, Ge may be additionally included.

Note here that, virtually, the characteristics of the memory element 1 are dependent also on the composition ratio between Zr and Te in the ion source layer 21. This is not necessarily evident, but seems due to the fact that the dissociation degree of Cu is lower than that of Zr, and the resistance value of the ion source layer 21 is determined by the composition ratio between Zr and Te.

In the below, the manufacturing method of the memory element 1 in the embodiment is described.

First, on a substrate on which a CMOS circuit such as selection transistor is formed, the lower electrode 10 made of TiN is formed, for example. Thereafter, if needed, oxides or others on the surface of the lower electrode 10 are removed by reverse sputtering, for example. Next, the formation of the resistance change layer 22, the ion source layer 21, and the upper electrode 30 is performed in succession through exchange of targets in a device for sputtering. The targets herein are those each with the composition adapted for the material of the corresponding layer. Introduction of nitrogen to the resistance change layer 22 is performed by reactive sputtering, for example. The reactive sputtering is a technique for introducing nitrogen gas during sputtering. The diameter of the electrode is 50 to 300 nmφ. A film of alloy is formed at the same time using a target of a component element.

After the formation of layers up to the upper electrode 30, a wiring layer (not illustrated) to be connected with the upper electrode 30 is formed, and a contact section is connected to achieve a common potential among all of the memory elements 1. Thereafter, the layered film is subjected to a post-annealing process. As such, the memory element 1 of FIG. 1 is completed.

In the memory element 1 in this embodiment, as described above, the resistance change layer 22 contains nitrogen in addition to the chalcogen element of Te. This accordingly allows the retention characteristics to remain satisfactory, and the repetitive operation characteristics to be improved. Furthermore, by containing Al in the resulting resistance change layer 22, retention characteristics and repetitive operation characteristics are further improved.

Moreover, as the ion source layer 21 contains Cu, Zr, and Ge, the characteristics of data retention are further improved.

[Memory Device]

By arranging a large number of memory elements 1 described above in rows or in a matrix, for example, a memory device (memory) is possibly configured. At this time, as appropriate, the memory elements 1 may be each connected with a MOS (Metal Oxide Semiconductor) transistor for element selection use or with a diode to configure a memory cell. The resulting memory cells may be then each connected to a sense amplifier, an address decoder, circuits of writing, erasing, and reading, and others by wiring.

Figure 2:
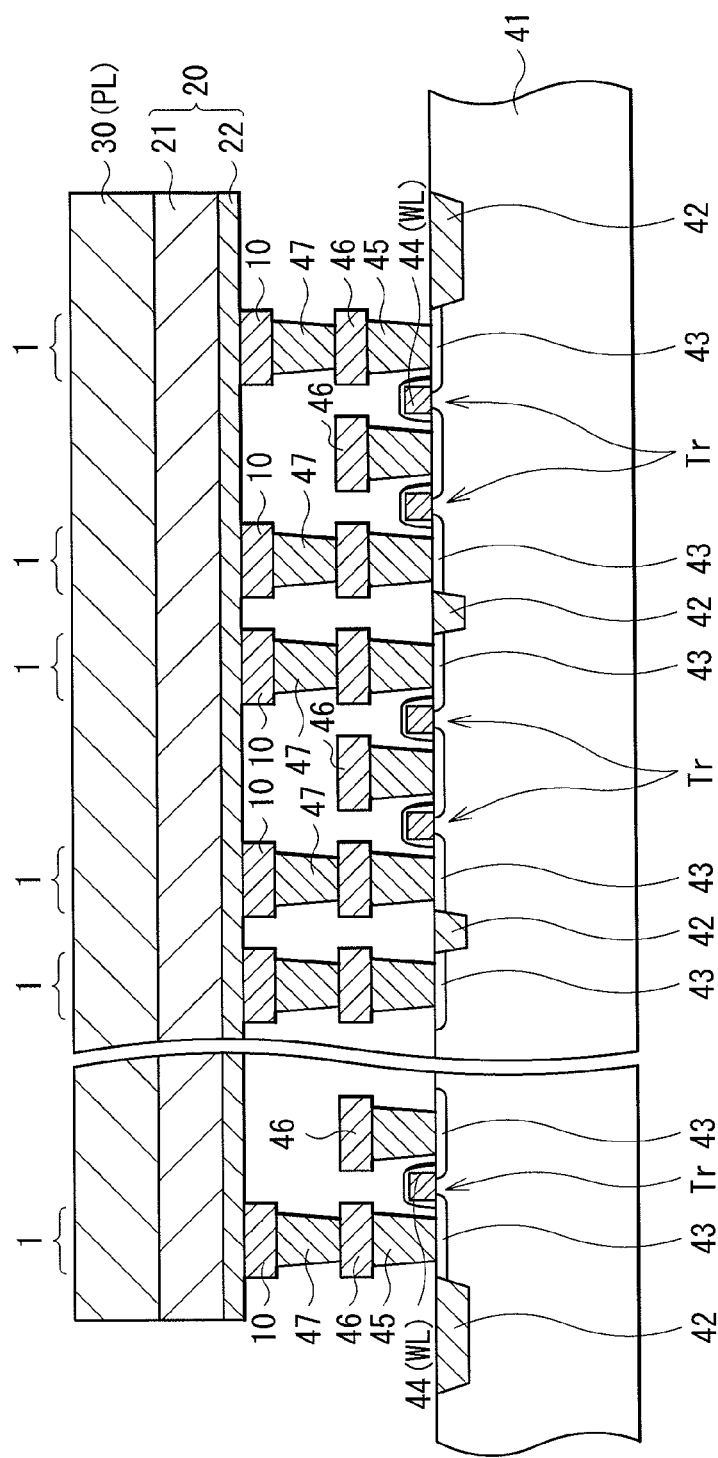
FIG. 2 is a cross-sectional diagram showing the configuration of a memory cell array using the memory element of FIG. 1.
Figure 3:
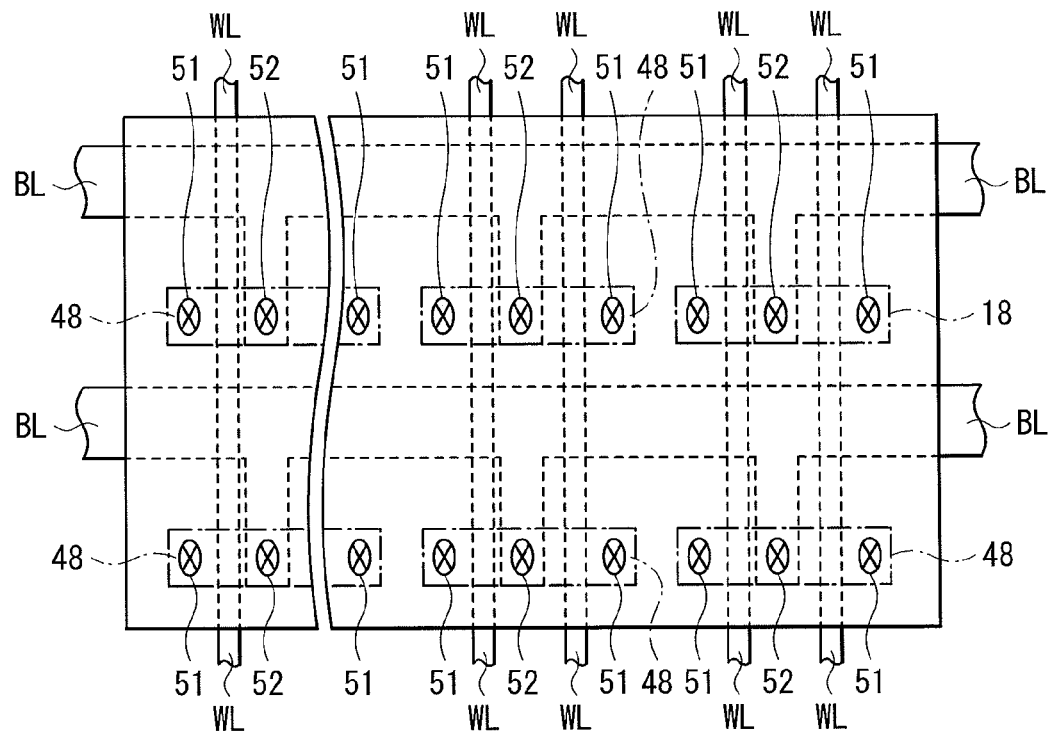
FIG. 3 is a plan view of the memory cell array of FIG. 2.

FIGS. 2 and 3 each show an exemplary memory device (memory cell array) including a large number of memory elements 1 arranged in a matrix. FIG. 2 shows the cross-sectional configuration of the memory cell array, and FIG. 3 shows the configuration thereof in a planar view. In this memory cell array, to each of the memory elements 1, wiring for connection to the lower electrode 10 side thereof is so provided as to intersect wiring for connection to the upper electrode 30 side thereof, and near the respective intersection points, the memory element 1 is disposed.

The memory elements 1 all share the layers including the resistance change layer 22, the ion source layer 21, and the upper electrode 30. That is, these layers including the resistance change layer 22, the ion source layer 21, and the upper electrode 30 are each shared by all of the memory elements 1 (are each one specific layer for use by all of the memory elements 1). The upper electrode 30 is a plate electrode PL shared by adjacent cells.

On the other hand, the lower electrode 10 is provided individually to each of the memory cells so that the adjacent memory cells are electrically separated from one another. As such, the memory elements 1 in the memory cells are each defined in a position corresponding to each lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. A side wall insulation layer is formed on the wall surface of the gate electrode 44 with a side wall insulation layer. The gate electrode 44 serves also as a word line WL, which is one of the address wirings for the memory element 1. One of the source/drain regions 43 of the MOS transistor Tr is electrically connected to the lower electrode 10 of the memory element 1 via a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 3), which is the remaining piece of the address wirings for the memory element 1. Note that, in FIG. 3, an active region 48 of the MOS transistor Tr is indicated by alternate long and short dashed lines, and each contact section 51 is connected to the lower electrode 10 of the memory element 1, and each contact section 52 is connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain of the MOS transistor Tr. In this example, when the voltage applied to the lower electrode 10 has a polarity at a negative potential compared with the potential of the upper electrode 30 (the plate electrode PL), the resistance value of the memory element 1 is changed to the low resistance state as described above, whereby information is written to the selected memory cell. Next, when a voltage having a positive potential compared with the potential of the upper electrode 30 (the plate electrode PL) is applied, the resistance value of the memory element 1 is changed again to the high resistance state, whereby the information written to the selected memory cell is erased. For reading of the written information, for example, a selection of a memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the end of the bit line BL or of the plate electrode PL. Herein, the voltage or current for application to the selected memory cell is set to be smaller than the threshold value of the voltage or others at which the memory element 1 shows a change of resistance value.

The memory device of this embodiment is applicable to various types of memory devices as described above. For example, the memory device is applicable for use with various types of memories such as once-writable PROM, electrically erasable EEPROM, or so-called RAM available for high-speed writing, erasing, and reproduction.

Modification

Figure 4:
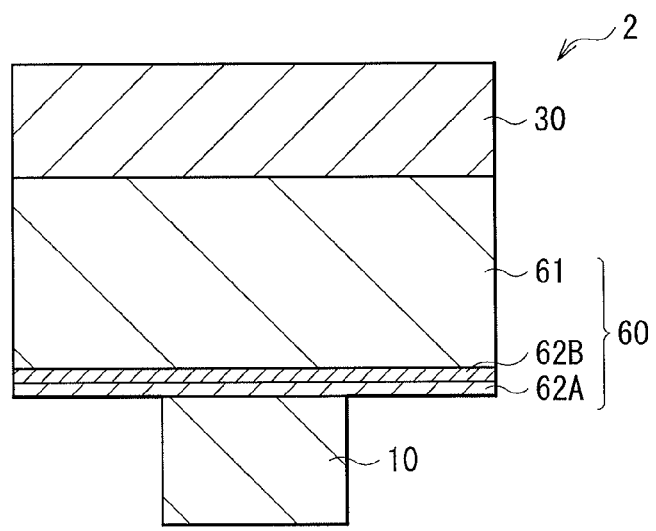
FIG. 4 is a cross-sectional diagram showing the configuration of a memory element according to a modification of the present disclosure.

Described next is a memory element 2 in a modification of the embodiment described above. FIG. 4 is a cross-sectional view of the memory element 2, showing the configuration thereof. Although the memory element 2 is now described, a structure component similar to that in the embodiment above is provided with the same reference numeral, and is not described again. This memory element 2 is configured to include the lower electrode 10 (first electrode), a memory layer 60, and the upper electrode 30 (second electrode) in this order.

The memory layer 60 includes an ion source layer 61, and a resistance change layer 62. The ion source layer 61 has the composition similar to that of the ion source layer 21 described above, and the resistance change layer 62 has a laminated structure including a first resistance change layer 62A and a second resistance change layer 62B disposed in this order from the lower electrode 10 side. In other words, the memory layer 60 is structured to include a resistance change layer formed of a plurality of layers. In this example, the first resistance change layer 62A and the second resistance change layer 62B are in contact with the lower electrode 10 and the ion source layer 61, respectively.

The first resistance change layer 62A and the second resistance change layer 62B each serve as a barrier against electric conduction similarly to the resistance change layer 22 in the embodiment described above, and have different composition from each other. As such, the resulting memory element 2 does not vary that much in resistance value from in the initial state or in the state of erasing, and is capable of keeping the resistance value at writing and erasing even if the operation of writing and erasing is performed for a plurality of times.

Such a first resistance change layer 62A is preferably configured by an oxide or nitride containing one or more of rare-earth elements in a group including yttrium (Y), lanthanum (La), neodymium (Nd), samarium (Sm), gadolinium (Gd), terbium (Tb), and dysprosium (Dy), or by an oxide or nitride containing one or more elements in a group including silicon (Si), aluminum (Al), titanium (Ti), zirconium (Zr), and hafnium (Hf). This is because the resulting film is to be relatively flat in a nanometer level.

Similarly to the resistance change layer 22 in the embodiment described above, the second resistance change layer 62B is made of a compound containing nitrogen in addition to the chalcogen element of Te.

Alternatively, the first resistance change layer 62A and the second resistance change layer 62B may be configured by oxides or nitrides containing elements varying in physical properties such as atomic weight, or atomic diameter, or by oxides or nitrides varying in properties such as oxides or nitrides having wettability different from that of the ion source layer 61. If this is the structure, the resulting complementary effect is allowed to be great.

To be specific, the first resistance change layer 62A may contain gadolinium oxide (GdOx), and the second resistance change layer 62B may contain a nitride of aluminum (Al) or silicon (Si) or an oxide thereof (aluminum oxide (AlOx) or silicon oxide (SiOx)).

If this is the case, because the first resistance change layer 62A containing gadolinium oxide (GdOx) contributes to the formation of a filament, the first resistance change layer 62A is thus preferably disposed to be in contact with the lower electrode 10. The second resistance change layer 62B made of a nitride or oxide of aluminum (Al) or silicon (Si) is disposed between the first resistance change layer 62A and the ion source layer 61. This accordingly produces a supplementary effect to a defect of the gadolinium oxide film (GdOx) by aluminum (Al) or silicon (Si) with a smaller atomic diameter than that of gadolinium (Gd).

Alternatively, the first resistance change layer 62A is not necessarily made of gadolinium oxide (GdOx), but may be configured also by a material that is allowed to produce the low-resistance state by forming an impurity level with ions of a metallic element provided by the ion source layer 61 with voltage bias, e.g., oxide or nitride of aluminum (Al) or silicon (Si). If this is the case, the effect similar to that described above is to be produced with the second resistance change layer 62B configured to have the physical properties such as atomic weight or atomic diameter different from those of the first resistance change layer 62A, or to have the properties such as wettability different from those of the ion source layer 61.

In the memory element 2 in the modification, the resistance change layer 62 has the multi-layer structure including the first resistance change layer 62A and the second resistance change layer 62B different from each other in composition. Accordingly, the following effect is produced in addition to the effect achieved in the embodiment described above. That is, providing the first resistance change layer 62A made of an oxide on the lower electrode 10 further suppresses degradation of the element characteristics due to repeated operation of writing and erasing. Moreover, this eases the formation of an oxide or nitride film at the time of erasing, thereby suppressing degradation of insulation that is caused by excessive voltage application at the time of erasing. As such, the repetitive operation characteristics are expected to be improved thereby. What is more, this allows to widen the resistance range of a tellurium compound film available for use so that the selection range of materials for use is increased.

In the below, a specific example according to the embodiment of the present disclosure is described.

EXAMPLE

Various samples were manufactured as below for the memory elements 1 and 2, and the memory cell array in the embodiment described above, and their characteristics were examined.

Experiment 1

Samples 1-1 to 1-3

First, as shown in FIGS. 2 and 3, a MOS transistor Tr was formed on the semiconductor substrate 41. Next, an insulation layer was so formed as to cover the surface of the substrate 41, and a via hole was formed in this insulation layer. Thereafter, by CVD (Chemical Vapor Deposition), the via hole was filled with an electrode material made of W (tungsten), and the surface of the resulting via hole was made flat by CMP (Chemical Mechanical Polishing). Thereafter, by repeating such processes, the plug layer 45, the metallic wiring layer 46, the plug layer 47, and the lower electrode 10 were formed, and then the lower electrode 10 was subjected to patterning on the memory cell basis.

Next, the memory layer 20 or 60, and the upper electrode 30 were formed on the lower electrode 10 using a device for sputtering. The diameter of the electrode was 50 to 300 nmφ. A film of alloy was formed at the same time using the target of a component element. Thereafter, the upper electrode 30 was subjected to etching on the surface, thereby forming a wiring layer (Al layer) with the thickness of 200 nm for a connection to a contact portion where an external circuit was connected for provision of an intermediate potential (Vdd/2). Thereafter, as a post-annealing process, in a furnace for a vacuum heat treatment, the resulting structure was subjected to a heat treatment for two hours at the temperature of 200° C. In this manner, the memory cell arrays shown in FIGS. 2 and 3 were manufactured, and were used as Samples 1-1 to 1-3.

In samples 1-1 to 1-3, the composition and the film thickness of "lower electrode/resistance change layer/ion source layer/upper electrode" were "TiN/Al4Te6 (5 nm)/TeAlZrCuGe (50 nm)/W (50 nm)". The composition and the film thickness of the ion source layer 21 and the upper electrode 30 were fixed, and the state of the lower electrode 10 and that of the resistance change layer were varied. Table 1 is a list of the oxidation state of the lower electrode 10, and the composition of the resistance change layer in Samples 1-1 to 1-3. In Sample 1-2, because the lower electrode 10 was subjected to plasma oxidation, the composition and the film thickness were "TiN/TiOx/AlOx/Al4Te6 (5 nm)/TeAlZrCuGe (50 nm)/W (50 nm)" because the surface of the lower electrode 10 was oxidized, and the resistance change layer was partially oxidized. Sample 1-3 is an example of the embodiment described above, and the composition and the film thickness were "TiN/[Al4Te6]-N4.4% (5 nm)/TeAlZrCuGe (50 nm)/W (50 nm)" with the nitrogen content of 4.4% in the resistance change layer 22. Herein, the composition of the resistance change layer in Table 1 is the composition used at the time of manufacturing. The actual composition of the resistance change layer 22 may be changed because movable ions such as Cu, Zr, or Al in the ion source layer 21 were diffused in the resistance change layer 22 by a heat treatment performed in the manufacturing processes.

TABLE 1

| Sample No. | Oxidation of Lower Electrode | Resistance Change Layer | | |
|---|---|---|---|---|
| | | Nitrogen Content (%) | Al/Te | Film Thickness (nm) |
| 1-1 | No | 0 | 4/6 | 5 |
| 1-2 | Yes | 0 | | |
| 1-3 | No | 4.4 | | |

First, Samples 1-1 to 1-3 were each assessed in terms of the repetitive operation characteristics based on the resistance to pressure thereof. In the Samples, the higher resistance to pressure led to the more improved repetitive operation characteristics. The resistance to pressure was obtained using an index of pressure resistance. This pressure resistance index is the one indicating an after-voltage-application resistance value with respect to a before-voltage-application resistance value. The voltage application at this time is application of a voltage of 2 to 3 V to Samples 1-1 to 1-3 in the erase-bias direction for 1 sec (second). When the resistance value shows no change before and after the voltage application, the pressure resistance index indicates 1. If the resistance change layer 22 becomes defective after the voltage application due to damage, for example, this causes the reduction of the resistance value, and thus the pressure resistance index indicates a value smaller than 1.

Figure 5:
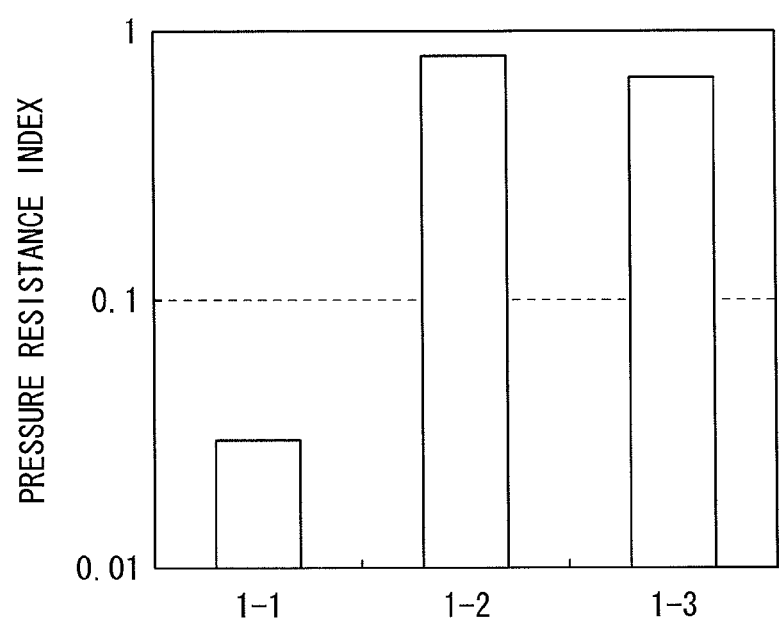
FIG. 5 is a diagram showing the repetitive operation characteristics of a memory element according to Experiment 1.

FIG. 5 shows the result of average value calculation performed with respect to Samples 1-1 to 1-3 through measurement of the pressure resistance index of every 0.2 V (2.0, 2.2, 2.4, 2.6, 2.8, and 3.0 V). In Sample 1-2, the lower electrode 10 was oxidized, and thus the resistance to pressure was higher than that in Sample 1-1. In Sample 1-3, the resistance change layer 22 included nitrogen, and thus the resistance to pressure was similar to that of Sample 1-2.

Next, Samples 1-1 to 1-3 were each assessed in terms of the retention characteristics as below. First, an operation of writing was performed with a current during recording of 1 to 30 μA, and a voltage for recording of 3.5 V. Thereafter, an operation of erasing was performed with a current during erasing of 60 μA, and a voltage for erasing of 2 V. With such operations, the resistance value was measured in each state of writing and erasing for Samples 1-1 to 1-3. Thereafter, similarly, the resistance value was measured again for Samples 1-1 to 1-3 after a high-temperature accelerated retention test performed at 130° C. for an hour. For this measurement, a pulse duration was 2 ns to 100 ms, and a pulse duration during erasing was 1 ms.

Figure 6A:
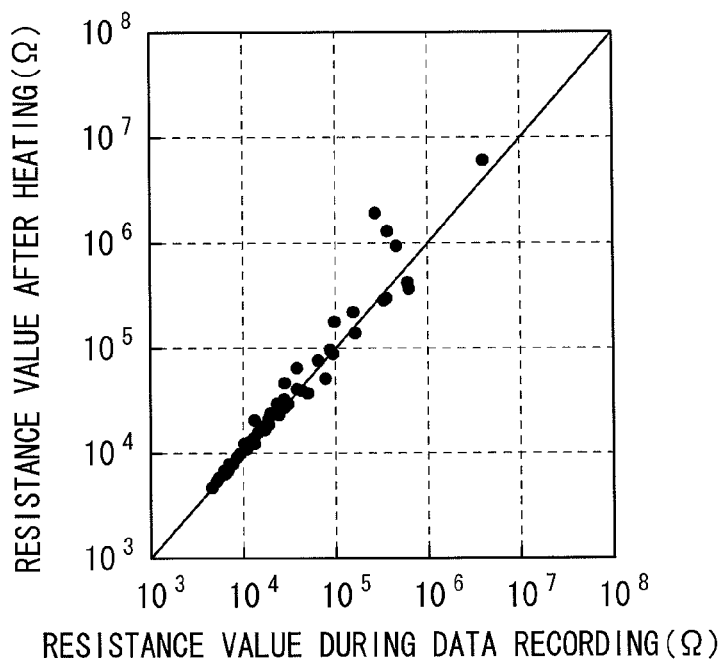
FIGS. 6A and 6B are each a diagram showing the retention characteristics of a memory element according to Sample 1-1 of FIG. 5.
Figure 6B:
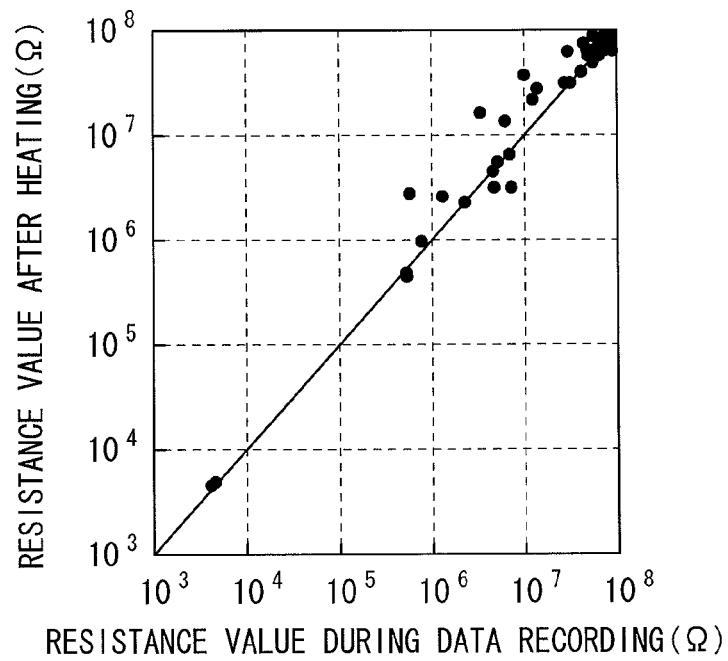
Figure 7A:
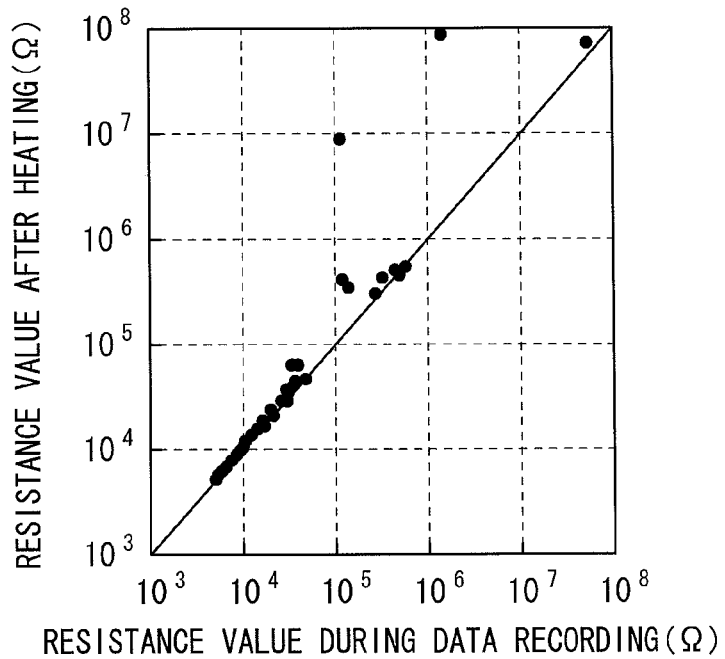
FIGS. 7A and 7B are each a diagram showing the retention characteristics of a memory element according to Sample 1-2 of FIG. 5.
Figure 7B:
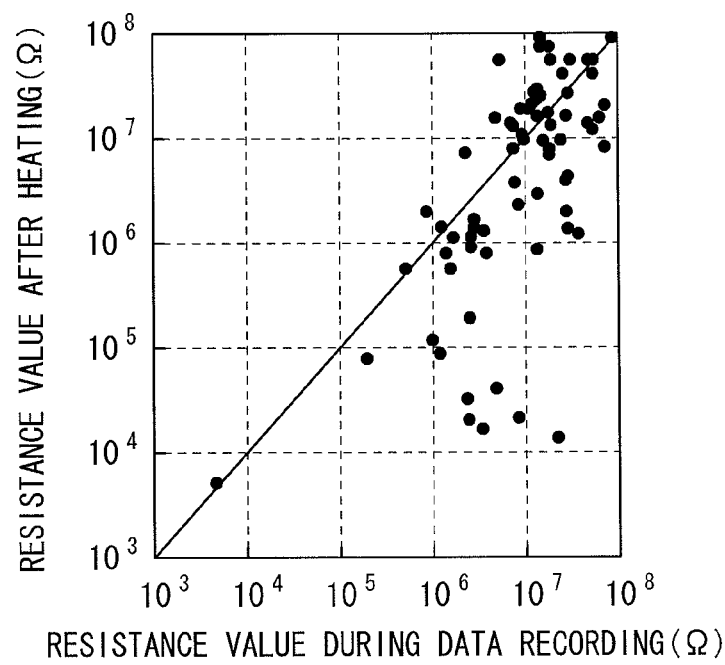
Figure 8A:
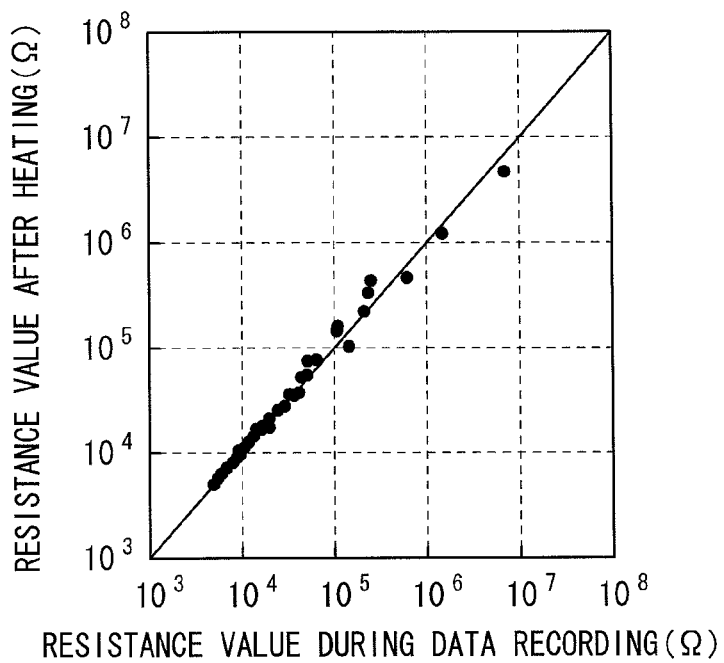
FIGS. 8A and 8B are each a diagram showing the retention characteristics of a memory element according to Sample 1-3 of FIG. 5.
Figure 8B:
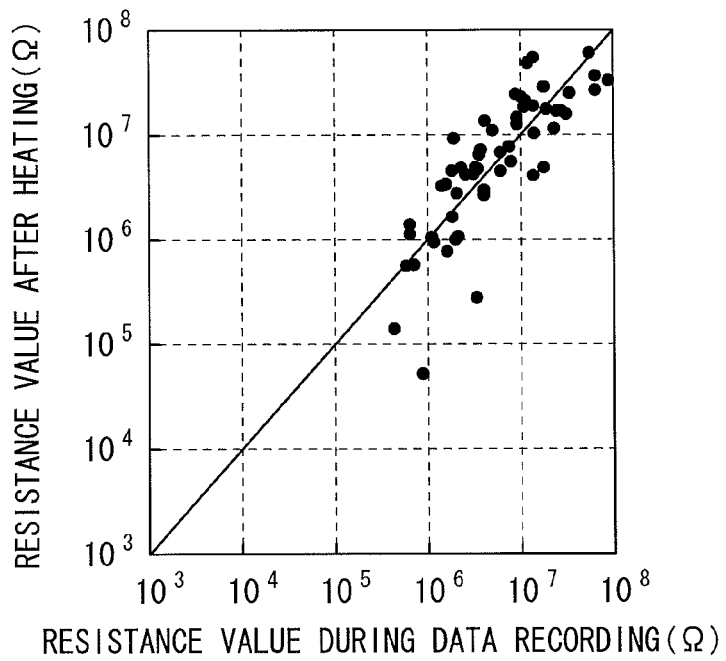

FIGS. 6A and 6B, 7A and 7B, and 8A and 8B respectively show the retention characteristics of Samples 1-1, 1-2, and 1-3. In FIGS. 6A to 8B, the horizontal axis indicates the resistance value before the high-temperature accelerated retention test (resistance value at the time of data recording), and the vertical axis indicates the resistance value after the high-temperature accelerated retention test (resistance value after the heating). FIGS. 6A, 7A, and 8A respectively show the retention characteristics of Samples 1-1 to 1-3 in the state of writing, and FIGS. 6B, 7B, and 8B respectively show the retention characteristics of Samples 1-1 to 1-3 in the state of erasing.

In the state of writing, Samples 1-1 to 1-3 all had the satisfactory retention characteristics, but in the state of erasing, Sample 1-2 had the retention characteristics being poor compared with those of Samples 1-1 and 1-3.

Figure 9:
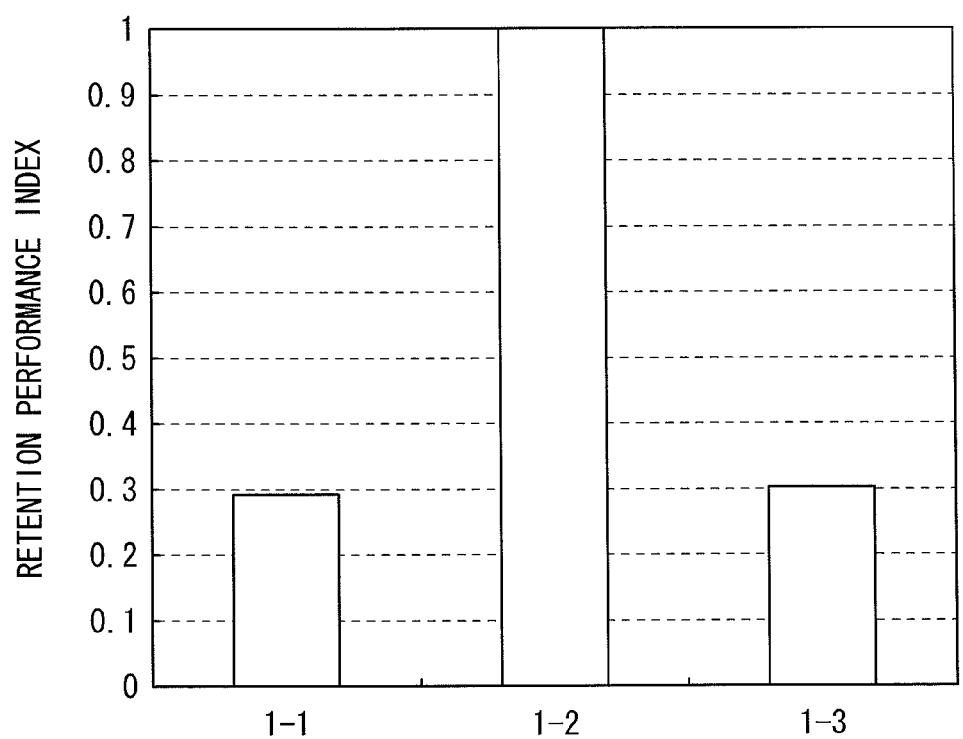
FIG. 9 is a diagram showing the retention characteristics of FIGS. 6A to 8B using a retention performance index.

FIG. 9 is a diagram showing the retention characteristics of Samples 1-1 to 1-3 described above using an index of retention performance. This retention performance index shows variation of resistance value relative to a reference value of no change before and after the high-temperature accelerated retention test, and the smaller the value is, the better the retention characteristics are. To be specific, the retention performance index ($I_R$) is calculated by Expressions (1) and (2) below. In Expressions (1) and (2), $R_b$ denotes a resistance value before the high-temperature accelerated retention test, $R_a$ denotes a resistance value after the high-temperature accelerated retention test, and m denotes the number of measurement points. FIG. 9 shows the retention characteristics of Samples 1-1 and 1-3 relative to the retention performance index of Sample 1-2 being 1. In the below, the use of the retention performance index is the same. In Sample 1-2 in which the lower electrode 10 was oxidized, the repetitive operation characteristics were high but the retention characteristics were low. In Sample 1-3 in which the resistance change layer 22 includes nitrogen, the retention characteristics were satisfactory as well as those in Sample 1-1.

$$An = \log\left(\frac{R_b}{R_a}\right) \quad (1)$$

$$I_R = \frac{\sum_{n=1}^{m} A_n^2}{m} \quad (2)$$

Experiment 2

Samples 2-1 to 2-10

Figure 10A:
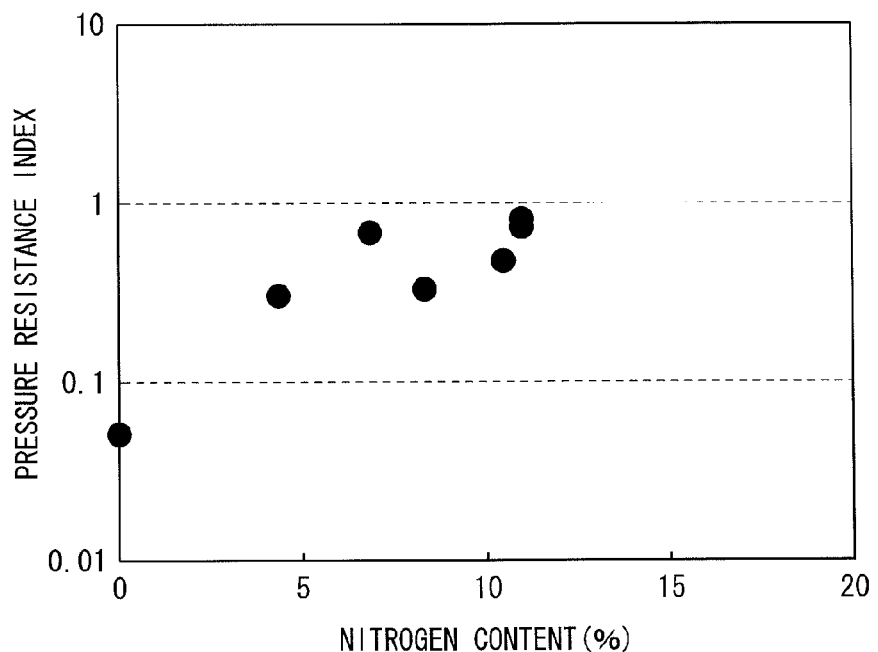
FIGS. 10A and 10B are each a diagram showing the repetitive operation characteristics and the retention characteristics of a memory element according to Experiment 2 (the nitrogen content in a lower electrode ≤1%).
Figure 10B:
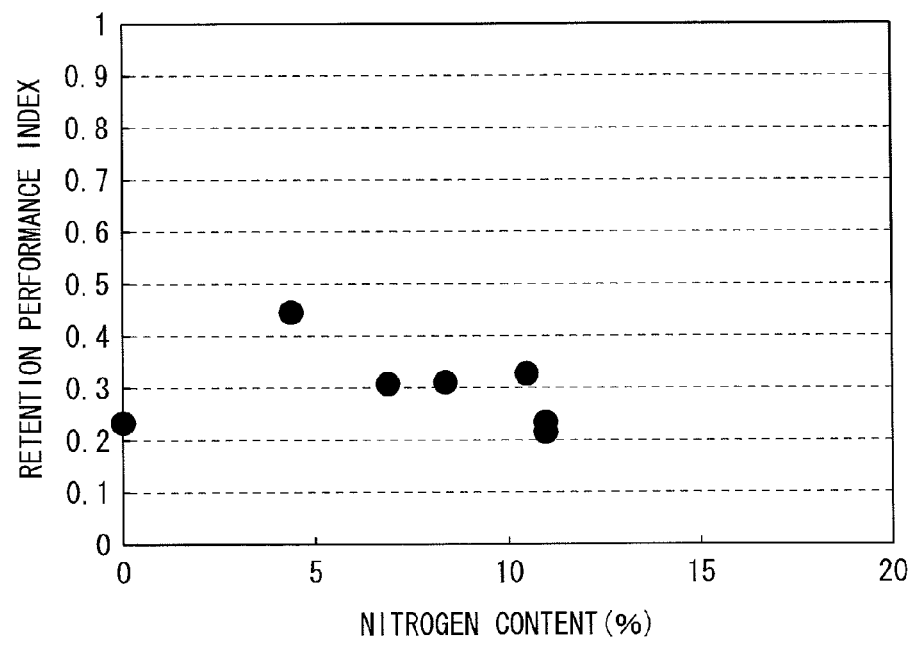
Figure 11A:
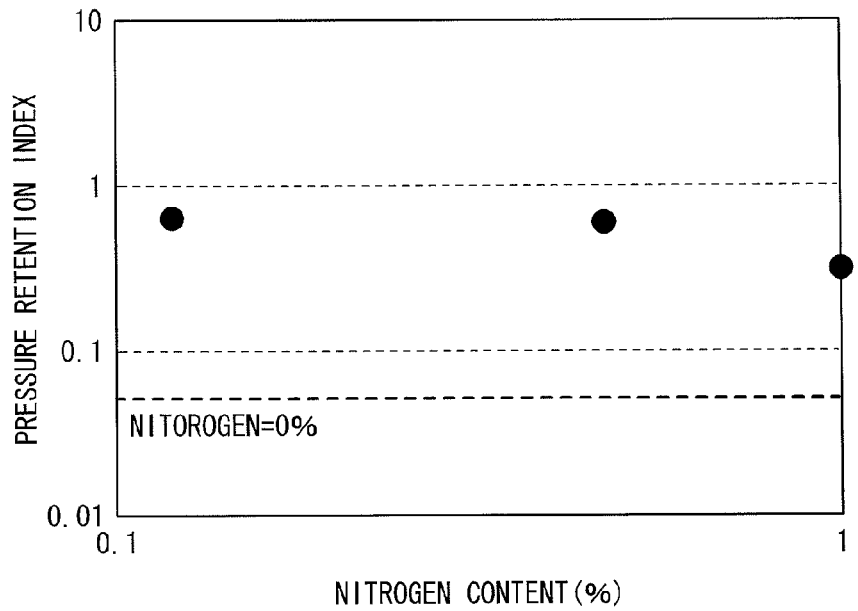
FIGS. 11A and 11B are each a diagram showing the repetitive operation characteristics and the retention characteristics of a memory element according to Experiment 2 (the nitrogen content in the lower electrode ≤1%).
Figure 11B:
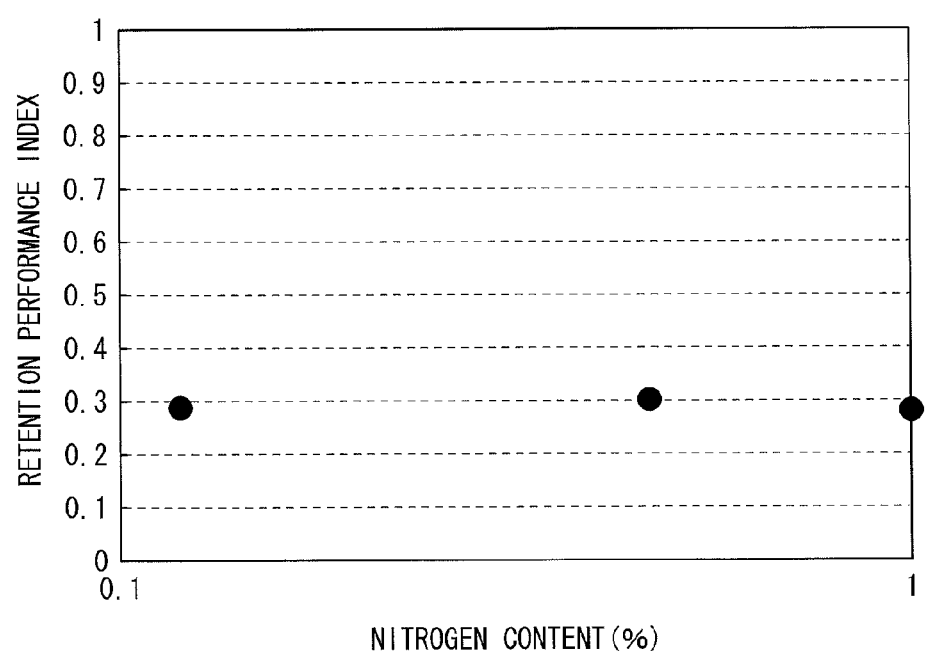

Using Samples 2-1 to 2-10, an experiment was carried out to study the influence of the nitrogen content in the resistance change layer 22 over the repetitive operation characteristics and the retention characteristics. FIGS. 10A and 11A show the result of calculating the pressure resistance index similarly to Experiment 1 for Samples 2-1 to 2-10, and FIGS. 10B and 11B show the result of calculating the retention performance index therefor. FIGS. 10A and 10B each mainly show the result of Samples in which the nitrogen content was larger than 1%, and FIGS. 11A and 11B each mainly show the result of Samples in which the nitrogen content was 1% or smaller. In Samples 2-1 to 2-10, the composition and the film thickness of "lower electrode/resistance change layer/ion source layer/upper electrode" were "TiN/[Al2Te8]-N/TeAlZrCuGe (50 nm)/W (50 nm)". Table 2 shows the composition and the film thickness of the resistance change layer 22.

TABLE 2

| Sample Number | Nitrogen Content (%) | Al/Te | Film Thickness (nm) |
|---|---|---|---|
| 2-1 | 0 | 2/8 | 3.5 |
| 2-2 | 4.4 | | 4 |
| 2-3 | 6.9 | | 4 |
| 2-4 | 8.4 | | 4 |
| 2-5 | 10.5 | | 3 |
| 2-6 | 11 | | 4 |
| 2-7 | 11 | | 3 |
| 2-8 | 0.12 | | 4 |
| 2-9 | 0.47 | | 4 |
| 2-10 | 1 | | 4 |

In comparison with Sample 2-1 in which the resistance change layer did not include nitrogen, Samples 2-2 to 2-10 including nitrogen all had a high pressure resistance, and the higher nitrogen content was likely to increase the resistance to pressure. In Samples 2-2 to 2-10, the retention characteristics were almost the same as those of Sample 2-1, and were sufficiently higher than those of Sample 1-2 (the retention performance index was sufficiently smaller than 1). Herein, the nitrogen content was measured using the X-ray photoemission spectroscopy (XPS). The values in Samples 2-8 to 2-10 (nitrogen content of 0.12 to 1%) were close to the measurement limit with this measurement technique, but were confirmed also to have the effect similar to that in Samples 2-2 to 2-7 (FIGS. 11A and 11B).

Experiment 3

Samples 3-1 to 3-18

Figure 12A:
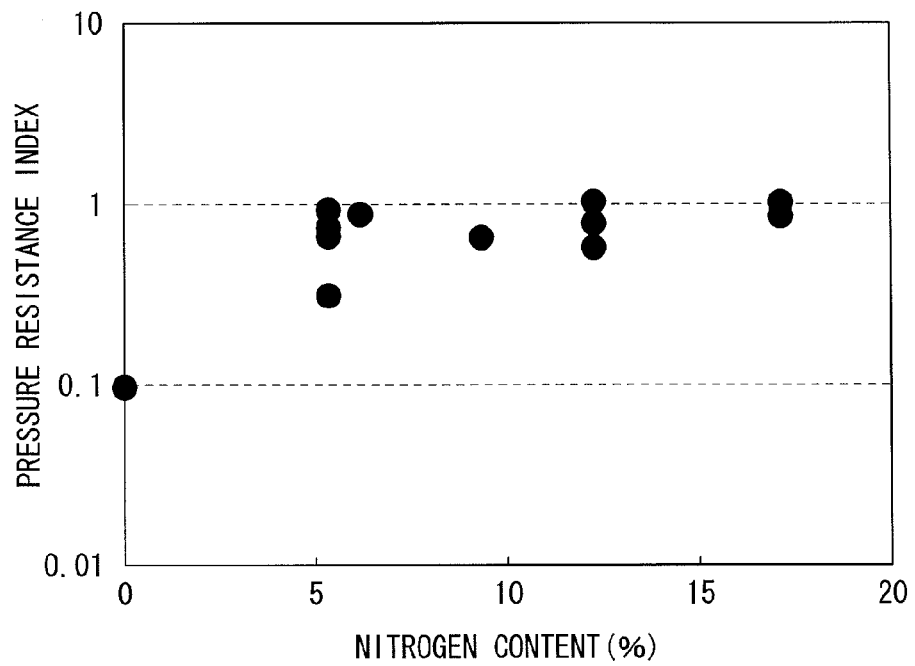
FIGS. 12A and 12B are each a diagram showing the repetitive operation characteristics and the retention characteristics of a memory element according to Experiment 3 (the nitrogen content in the lower electrode >1%).
Figure 12B:
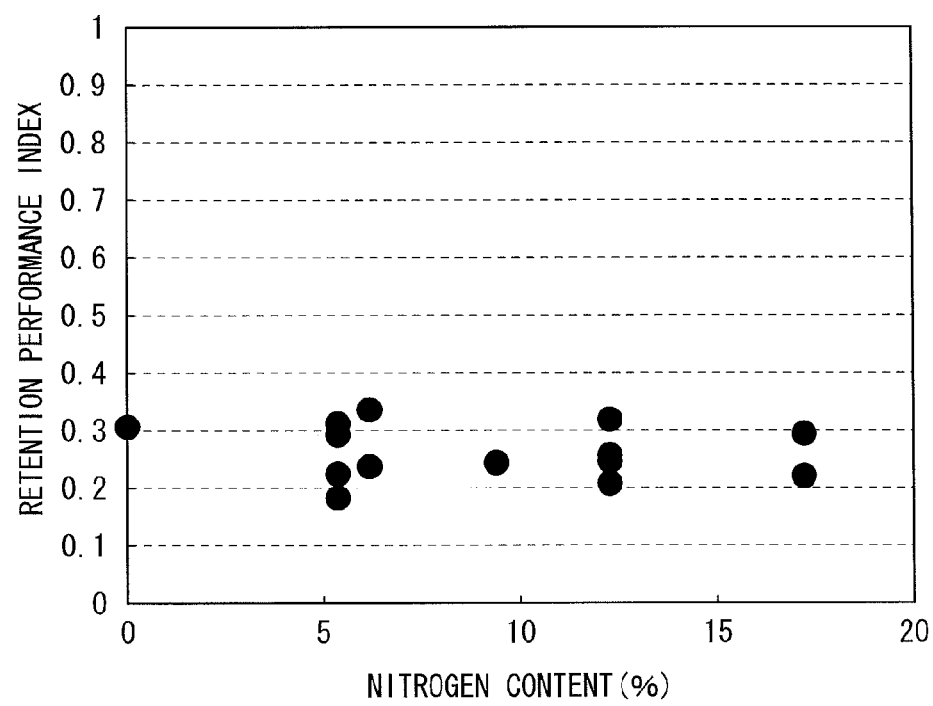

FIGS. 12A to 13B show the result of an experiment carried out to study the influence of the nitrogen content over the repetitive operation characteristics and the retention characteristics in a manner similar to Experiment 2. In the resistance change layer 22 of Experiment 3, the ratio between Al and Te was set as Al/Te=4/6. FIGS. 12A and 13A each show the pressure resistance index, and FIGS. 12B and 13B each show the retention performance index. FIGS. 12A and 12B each mainly show the result of Samples in which the nitrogen content was larger than 1%, and FIGS. 13A and 13B each mainly show the result of Samples in which the nitrogen content was 1% or smaller. In Samples 3-1 to 3-18, the composition and the film thickness of "lower electrode/resistance change layer/ion source layer/upper electrode" were "TiN/[Al4Te6]-N/TeAlZrCuGe (50 nm)/W (50 nm)". Table 3 shows the composition and the film thickness of the resistance change layer 22.

TABLE 3

| Sample Number | Nitrogen Content (%) | Al/Te | Film Thickness (nm) |
|---|---|---|---|
| 3-1 | 0 | 4/6 | 3.5 |
| 3-2 | 5.4 | | 4 |
| 3-3 | 5.4 | | 4 |
| 3-4 | 5.4 | | 4 |
| 3-5 | 5.4 | | 4 |
| 3-6 | 5.4 | | 3.5 |
| 3-7 | 6.2 | | 4 |
| 3-8 | 6.2 | | 3.5 |
| 3-9 | 9.4 | | 4 |
| 3-10 | 12.3 | | 4 |
| 3-11 | 12.3 | | 3 |
| 3-12 | 12.3 | | 3 |
| 3-13 | 12.3 | | 2 |
| 3-14 | 17.2 | | 3 |
| 3-15 | 17.2 | | 2 |
| 3-16 | 0.16 | | 4 |
| 3-17 | 0.47 | | 4 |
| 3-18 | 1 | | 4 |

Figure 13A:
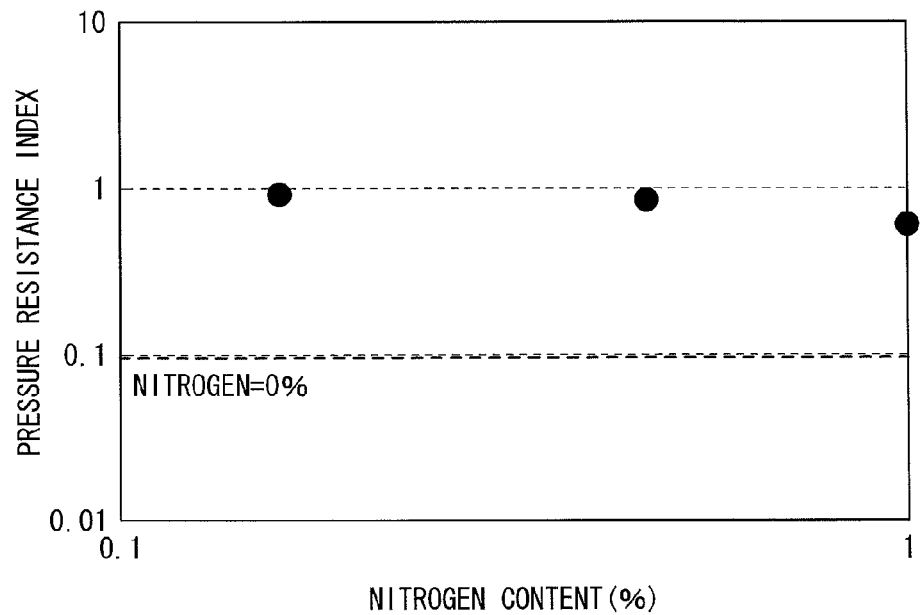
FIGS. 13A and 13B are each a diagram showing the repetitive operation characteristics and the retention characteristics of a memory element according to Experiment 3 (the nitrogen content in the lower electrode ≤1%).
Figure 13B:
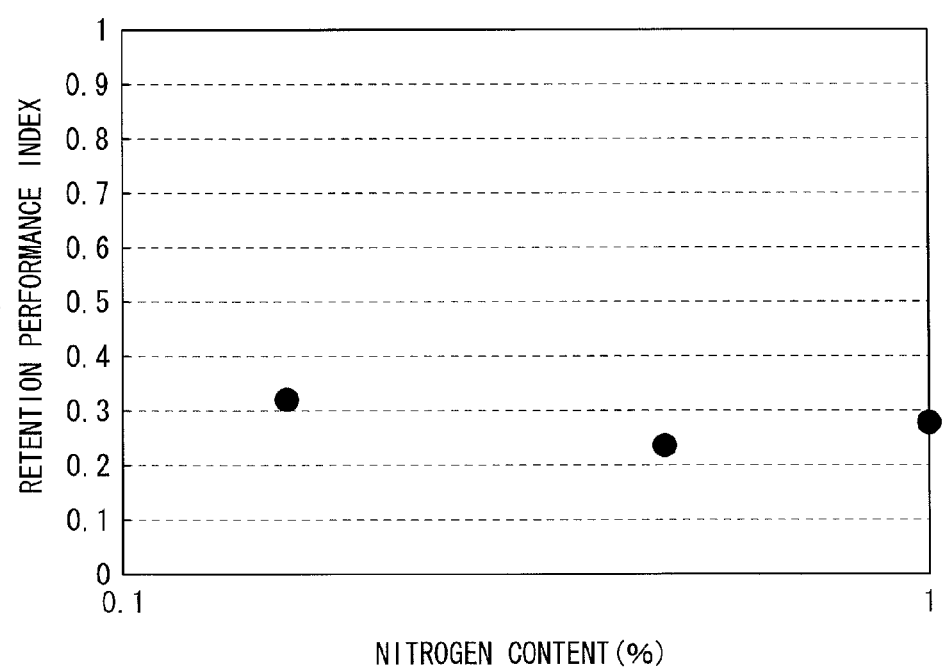

Similarly to FIGS. 10A to 11B, in comparison with Sample 3-1 not including nitrogen, Samples 3-2 to 3-18 including nitrogen had a high pressure resistance, and the higher nitrogen content was likely to increase the resistance to pressure. In Samples 3-2 to 3-18, the retention characteristics were almost the same as those of Sample 3-1, and were sufficiently higher than those of Sample 1-2 (sufficiently smaller than the retention performance index of 1). Similarly to Experiment 2 described above, the values in Samples 3-16 to 3-18 (nitrogen content of 0.16 to 1%) were close to the measurement limit with XPS, but were confirmed also to have the effect similar to that in Samples 3-2 to 3-15 (FIGS. 13A and 13B).

Experiment 4

Samples 4-1 to 4-3

Figure 14A:
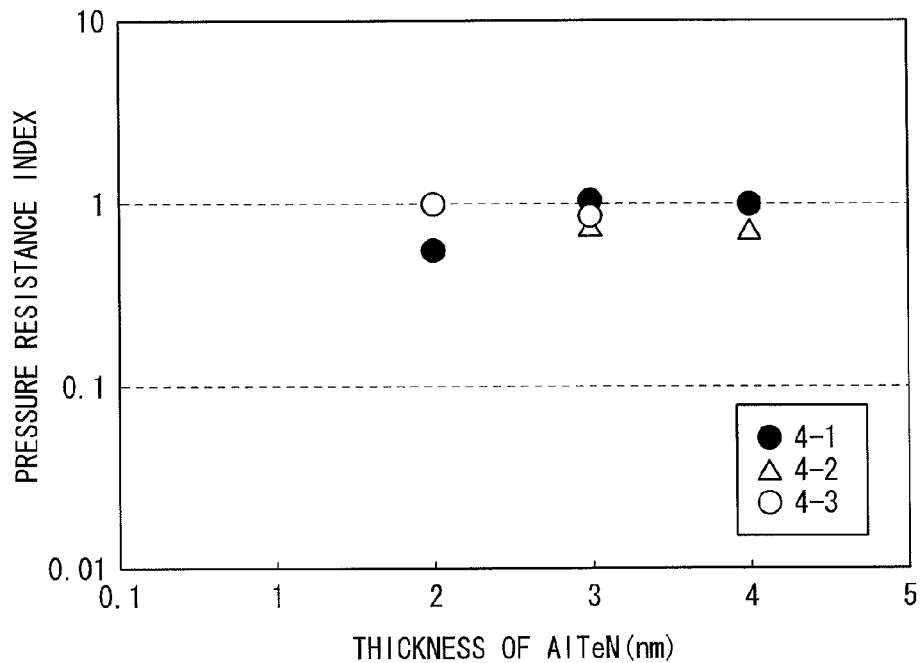
FIGS. 14A and 14B are each a diagram showing the repetitive operation characteristics and the retention characteristics of a memory element according to Experiment 4.
Figure 14B:
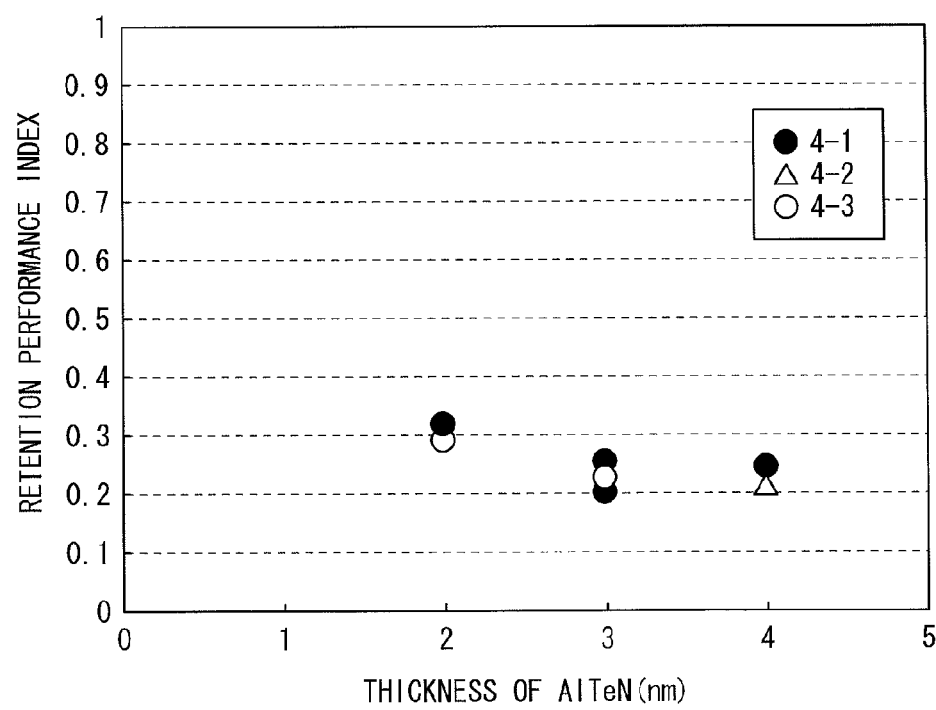

Samples 4-1 to 4-3 were each assessed in terms of the repetitive operation characteristics and the retention characteristics by varying the film thickness of the resistance change layer 22 in a range from 2 to 4 nm. FIGS. 14A and 14B show the result of the assessment, and specifically, FIG. 14A shows the pressure resistance index, and FIG. 14B shows the retention performance index. In Samples 4-1 to 4-3, the composition and the film thickness of "lower electrode/resistance change layer/ion source layer/upper electrode" were "TiN/[AlTe]-N/TeAlZrCuGe (50 nm)/W (50 nm)". Table 4 shows the composition and the film thickness of the resistance change layer 22.

TABLE 4

| Sample Number | | Nitrogen Content (%) | Al/Te | Film Thickness (nm) |
|---|---|---|---|---|
| 4-1 | (1) | 12.3 | 4/6 | 4 |
| | (2) | | | 3 |
| | (3) | | | 3 |
| | (4) | | | 2 |
| 4-2 | (1) | 11 | 2/8 | 4 |
| | (2) | | | 3 |
| 4-3 | (1) | 17.2 | 4/6 | 3 |
| | (2) | | | 2 |

FIGS. 14A and 14B show that the pressure resistance index and the retention performance index both had the film thickness dependence. The repetitive operation characteristics and the retention characteristics were improved with the increase of the film thickness, but even when the film thickness was the minimum of 2 nm in the measurement range, obtained were the satisfactory repetitive operation characteristics and retention characteristics.

Experiment 5

Samples 5-1 to 5-10

Figure 15A:
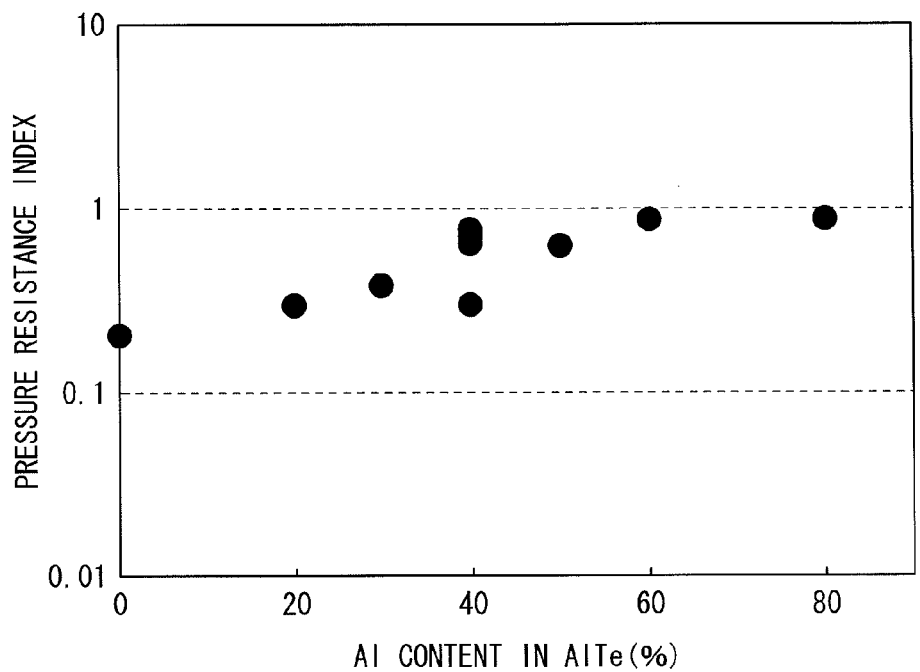
FIGS. 15A and 15B are each a diagram showing the repetitive operation characteristics and the retention characteristics of a memory element according to Experiment 5.
Figure 15B:
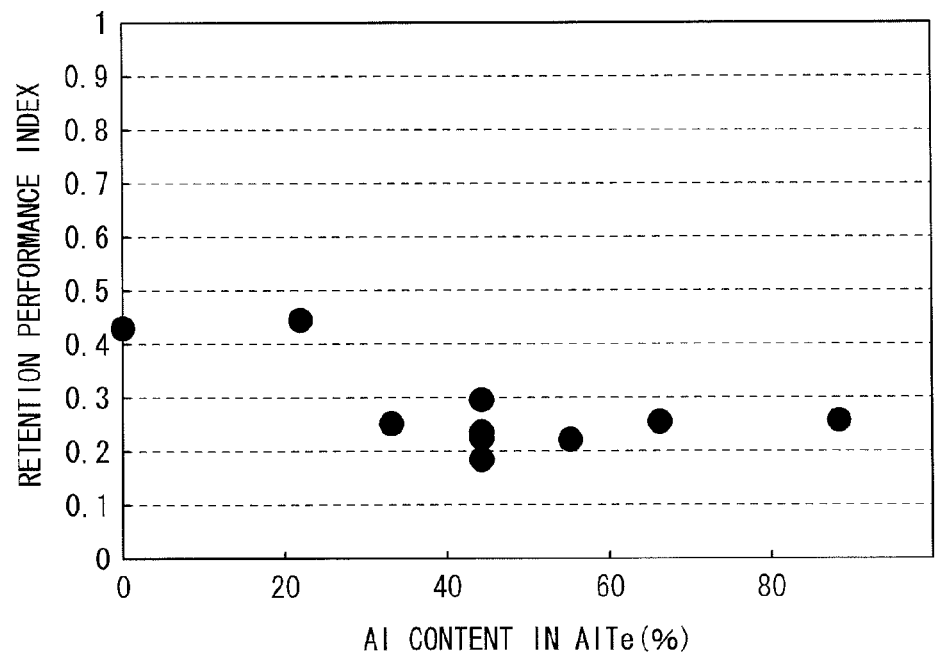

Samples 5-1 to 5-10 were each assessed in terms of the repetitive operation characteristics and the retention characteristics by varying the Al content in the resistance change layer 22, specifically, by varying a ratio of Al/Te. FIGS. 15A and 15B show the result of the assessment, and specifically, FIG. 15A shows the pressure resistance index, and FIG. 15B shows the retention performance index. In Samples 5-1 to 5-10, the composition and the film thickness of "lower electrode/resistance change layer/ion source layer/upper electrode" were "TiN/[AlTe]-N/TeAlZrCuGe (50 nm)/W (50 nm)". Table 5 shows the composition and the film thickness of the resistance change layer 22.

TABLE 5

| Sample Number | Nitrogen Content (%) | Al/Te | Film Thickness (nm) |
|---|---|---|---|
| 5-1 | 2.4 | 0 | 4 |
| 5-2 | 4.4 | 2/8 | 3.5 |
| 5-3 | 5 | 3/7 | 4 |
| 5-4 | 5.4 | 4/6 | 4 |
| 5-5 | | | |
| 5-6 | | | |
| 5-7 | | | |
| 5-8 | 6 | 5/5 | 4 |
| 5-9 | 6.4 | 6/4 | 4 |
| 5-10 | 8.4 | 8/2 | 4 |

Even though Sample 5-1 not including Al have the satisfactory repetitive operation characteristics and the retention characteristics, assessment result confirmed that the repetitive operation characteristics and the retention characteristics were improved with the increase of the Al content. However, with the Al content of 60% (Al/Te ratio=6/4) or more, no large change was observed in the pressure resistance index and the retention performance index.

Experiment 6

Samples 6-1 and 6-2

Figure 16A:
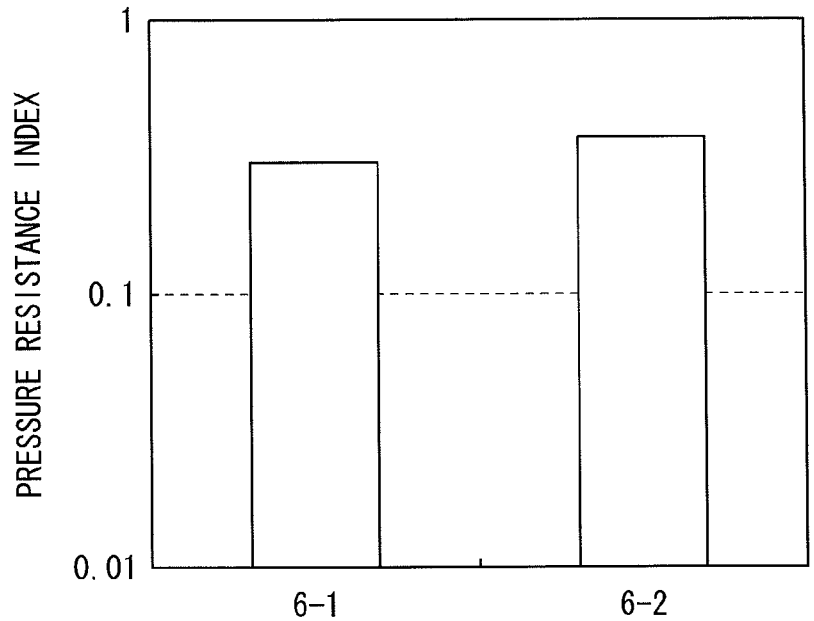
FIGS. 16A and 16B are each a diagram showing the repetitive operation characteristics and the retention characteristics of a memory element according to Experiment 6.
Figure 16B:
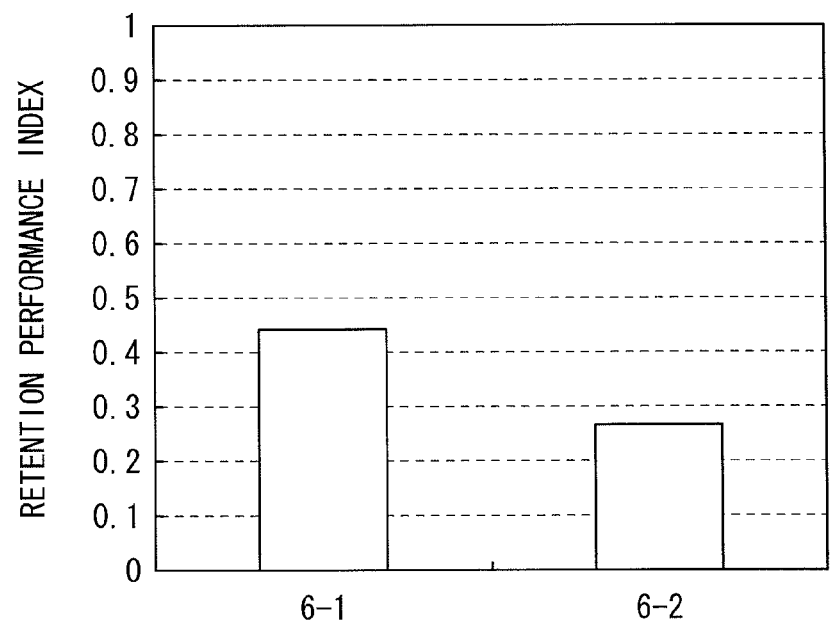

FIGS. 16A and 16B show the result of an experiment carried out to study a change in the repetitive operation characteristics and the retention characteristics due to oxidation of the lower electrode 10. FIG. 16A shows the pressure resistance index, and FIG. 16B shows the retention performance index. In Sample 6-1, the composition and the film thickness of "lower electrode/resistance change layer/ion source layer/upper electrode" were "TiN/[Al2Te8]-N4.4% (4 nm)/TeAlZrCuGe (50 nm)/W (50 nm)". As shown in Table 6, Sample 6-2 was obtained by submitting the lower electrode 10 of Sample 6-1 to plasma oxidation. In Sample 6-2, the composition and the film thickness were "TiN/TiOx/AlOx/[Al2Te8]-N4.4% (4 nm)/TeAlZrCuGe (50 nm)/W (50 nm)" as a result of the oxidation of the surface of the lower electrode 10 (the surface on the resistance change layer 22 side), and the oxidation of a part of the resistance change layer 22.

TABLE 6

| Sample Number | Oxidation of Lower Electrode | Resistance Change Layer | | |
|---|---|---|---|---|
| | | Nitrogen Content (%) | Al/Te | Film Thickness (nm) |
| 6-1 | No | 4.4 | 2/8 | 4 |
| 6-2 | Yes | | | |

By FIGS. 16A and 16B, the repetitive operation characteristics and the retention characteristics were confirmed as not being reduced even if the lower electrode 10 was oxidized.

Experiment 7

Samples 7-1 and 7-2

Figure 17A:
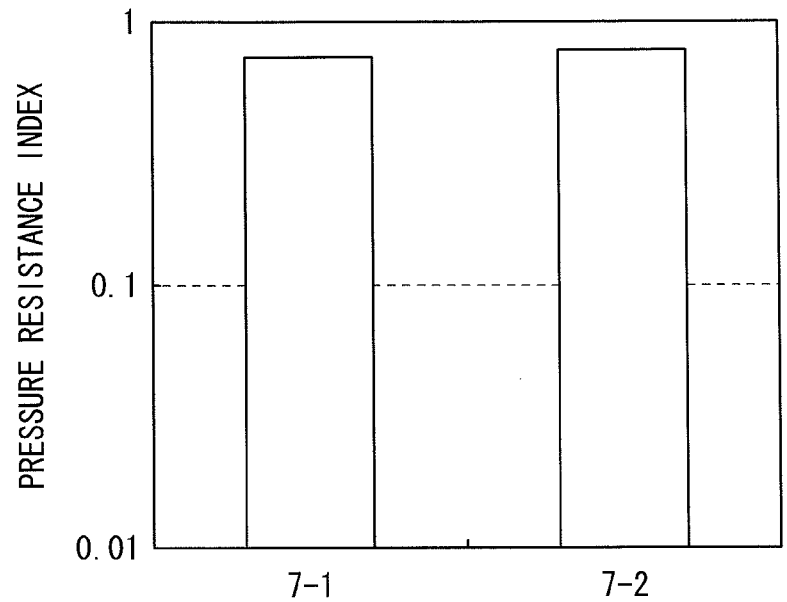
FIGS. 17A and 17B are each a diagram showing the repetitive operation characteristics and the retention characteristics of a memory element according to Experiment 7.
Figure 17B:
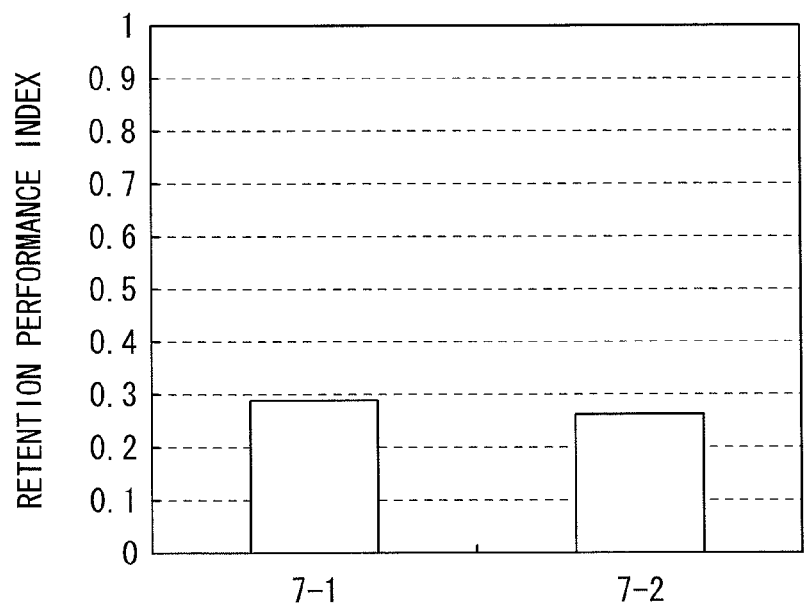

FIGS. 17A and 17B show the result of an experiment carried out to study a change in the repetitive operation characteristics and the retention characteristics in the case where the resistance change layer has the multi-layer structure. FIG. 17A shows the pressure resistance index, and FIG. 17B shows the retention performance index. In Sample 7-1, the composition and the film thickness of "lower electrode/resistance change layer/ion source layer/upper electrode" were "TiN/[Al4Te6]-N5.4% (4 nm)/TeAlZrCuGe (50 nm)/W (50 nm)". As shown in Table 7, in Sample 7-2, as the resistance change layer 22 (the first resistance change layer 62A), an aluminum oxide layer (AlOx) was formed on the lower electrode 10 side. In Sample 7-2, the composition and the film thickness were "TiN/AlOx (0.3 nm)/[Al4Te6]-N5.4% (4 nm)/TeAlZr-CuGe (50 nm)/W (50 nm)".

TABLE 7

| Sample Number | AlOx Layer | Resistance Change Layer | | |
|---|---|---|---|---|
| | | [AlTe]—N Layer | | |
| | | Nitrogen Content (%) | Al/Te | Film Thickness (nm) |
| 7-1 | No | 5.4 | 4/6 | 4 |
| 7-2 | Yes | | | |

By FIGS. 17A and 17B, the repetitive operation characteristics and the retention characteristics were confirmed as not being reduced even if the resistance change layer had the multi-layer structure including an oxide layer.

While the present technology has been described in detail by referring to the embodiment, Modification, and Example, the present technology is not restrictive to the embodiments and others described above, and numerous other modifications may be possibly devised.

For example, in the embodiment and others described above, the configurations of the memory elements 1, 2, and that of the memory cell array are specifically described. However, all of the layers are not necessarily provided, or any other layers may be also provided.

Further, for example, the materials of the layers, the film-forming methods and condition, and others described in the embodiment and others above are surely not restrictive, and any other materials, or any other film-forming methods may be used. For example, any other types of transition metallic element such as Ti, Hf, V, Nb, Ta, Cr, Mo, or W may be added to the ion source layer 21 and 61 as long as the composition ratio described above remains the same. Nickel (Ni) other than Cu, Ag, and Zn may be added to the ion source layers 21 and 61.

Furthermore, exemplified in Modification described above is the resistance change layer having the two-layer structure. Alternatively, the resistance change layer may have the multi-layer structure of three or more layers.

The present technology is also possibly in the following structures.

(1) A memory element, including:
a memory layer disposed between a first electrode and a second electrode, wherein
the memory layer includes
an ion source layer containing one or more metallic elements, and one or more chalcogen elements of tellurium (Te), sulfur (S), and selenium (Se), and
a resistance change layer disposed between the ion source layer and the first electrode, the resistance change layer including a layer which includes tellurium and nitrogen (N) and is in contact with the ion source layer.

(2) The memory element according to (1), wherein
the layer in contact with the ion source layer, in the resistance change layer, contains aluminum (Al).

(3) The memory element according to (1) or (2), wherein
the layer in contact with the ion source layer, in the resistance change layer, contains nitrogen of 0.1 percent or more and 50 percent or less.

(4) The memory element according to any one of (1) to (3), wherein
the metallic element includes one or more of silver (Ag), copper (Cu), and zinc (Zn).

(5) The memory element according to any one of (1) to (4), wherein
the metallic element includes copper (Cu), aluminum (Al), and zirconium (Zr).

(6) The memory element according to any one of (1) to (5), wherein
a surface, of the first electrode, closer to the resistance change layer is oxidized.

(7) The memory element according to any one of (1) to (6), wherein
the resistance change layer includes a first resistance change layer closer to the first electrode, and a second resistance change layer closer to the ion source layer, and
the first resistance change layer is an oxide layer.

(8) The memory element according to any one of (1) to (7), wherein
the one or more metallic element in the ion source layer moves in response to voltage application to the first and second electrodes, thereby to allow a resistance state of the resistance change layer to be changed to store information.

(9) A memory device, including:
a plurality of memory elements each including a memory layer disposed between a first electrode and a second electrode; and
a pulse application unit selectively applying a voltage or current pulse to the plurality of memory elements, wherein
the memory layer includes
an ion source layer containing one or more metallic elements, and one or more chalcogen elements of tellurium (Te), sulfur (S), and selenium (Se), and
a resistance change layer disposed between the ion source layer and the first electrode, the resistance change layer including a layer which includes tellurium and nitrogen (N) and is in contact with the ion source layer.

(10) The memory device according to (9), wherein
the layer in contact with the ion source layer, in the resistance change layer, contains aluminum (Al).

(11) The memory device according to (9) or (10), wherein
the layer in contact with the ion source layer, in the resistance change layer, contains nitrogen of 0.1 percent or more and 50 percent or less.

(12) The memory device according to any one of (9) to (11), wherein
the metallic element includes one or more of silver (Ag), copper (Cu), and zinc (Zn).

(13) The memory device according to any one of (9) to (12), wherein
the metallic element includes copper (Cu), aluminum (Al), and zirconium (Zr).

(14) The memory device according to any one of (9) to (13), wherein
a surface, of the first electrode, closer to the resistance change layer is oxidized.

(15) The memory device according to any one of (9) to (14), wherein
the resistance change layer includes a first resistance change layer closer to the first electrode, and a second resistance change layer closer to the ion source layer, and
the first resistance change layer is an oxide layer.

(16) The memory device according to any one of (9) to (14), wherein
the one or more metallic element in the ion source layer moves in response to voltage application to the first and second electrodes, thereby to allow a resistance state of the resistance change layer to be changed to store information.

The present disclosure contains subject matter related to that disclosed in Japanese Priority Patent Application JP 2011-129769 filed in the Japan Patent Office on Jun. 10, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising a memory layer disposed between a first electrode and a second electrode, wherein:
   a) the memory layer includes
      an ion source layer containing one or more metallic elements, and one or more chalcogen elements from the group of tellurium (Te), sulfur (S), and selenium (Se), and
      a high resistance layer disposed between the ion source layer and the first electrode, the high resistance layer including a layer which includes tellurium and nitrogen (N);
   b) the high resistance layer includes a first high resistance layer closer to the first electrode, and a second high resistance layer closer to the ion source layer; and
   c) the first high resistance layer includes an oxide layer.

2. The memory element according to claim 1, wherein the layer in contact with the ion source layer, in the high resistance layer, contains aluminum (Al).

3. The memory element according to claim 1, wherein the layer in contact with the ion source layer, in the high resistance layer, contains nitrogen of 0.1 percent or more and 50 percent or less.

4. The memory element according to claim 1, wherein the metallic element includes one or more from the group of silver (Ag), copper (Cu), and zinc (Zn).

5. The memory element according to claim 1, wherein the metallic element includes copper (Cu), aluminum (Al), and zirconium (Zr).

6. The memory element according to claim 1, wherein a surface, of the first electrode, closer to the high resistance layer is oxidized.

7. The memory element according to claim 1, wherein the one or more metallic element in the ion source layer moves in response to voltage application to the first and second electrodes, thereby to allow a resistance state of the high resistance layer to be changed to store information.

8. The memory element according to claim 1 wherein the high resistance layer is in contact with the ion source layer.

9. A memory device, comprising:
   a plurality of memory elements each including a memory layer disposed between a first electrode and a second electrode; and
   a pulse application unit that selectively applies a voltage or current pulse to the plurality of memory elements,
   wherein,
      a) the memory layer includes
         an ion source layer containing one or more metallic elements, and one or more chalcogen elements from the group of tellurium (Te), sulfur (S), and selenium (Se), and
         a high resistance layer disposed between the ion source layer and the first electrode, the high resistance layer including a layer which includes tellurium and nitrogen (N),
      b) the high resistance layer includes a first high resistance layer closer to the first electrode, and a second high resistance layer closer to the ion source layer, and
      c) the first high resistance layer includes an oxide layer.

10. The memory device according to claim 9, wherein the layer in contact with the ion source layer, in the high resistance layer, contains aluminum (Al).

11. The memory device according to claim 9, wherein the layer in contact with the ion source layer, in the high resistance layer, contains nitrogen of 0.1 percent or more and 50 percent or less.

12. The memory device according to claim 9, wherein the metallic element includes one or more from the group of silver (Ag), copper (Cu), and zinc (Zn).

13. The memory device according to claim 9, wherein the metallic element includes copper (Cu), aluminum (Al), and zirconium (Zr).

14. The memory device according to claim 9, wherein a surface, of the first electrode, closer to the high resistance layer is oxidized.

15. The memory device according to claim 9, wherein the one or more metallic element in the ion source layer moves in response to voltage application to the first and second electrodes, thereby to allow a resistance state of the high resistance layer to be changed to store information.

16. The memory device according to claim 9 wherein the high resistance layer is in contact with the ion source layer.

* * * * *